(12) United States Patent
Shimezawa et al.

(10) Patent No.: US 11,451,334 B2
(45) Date of Patent: Sep. 20, 2022

(54) INFRASTRUCTURE EQUIPMENT, COMMUNICATIONS DEVICE AND METHODS

(71) Applicant: Sony Corporation, Tokyo (JP)

(72) Inventors: Kazuyuki Shimezawa, Basingstoke (GB); Martin Warwick Beale, Basingstoke (GB); Shin Horng Wong, Basingstoke (GB); Yassin Aden Awad, Basingstoke (GB)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 17/272,354

(22) PCT Filed: Sep. 24, 2019

(86) PCT No.: PCT/EP2019/075709
§ 371 (c)(1),
(2) Date: Mar. 1, 2021

(87) PCT Pub. No.: WO2020/064730
PCT Pub. Date: Apr. 2, 2020

(65) Prior Publication Data
US 2021/0320753 A1 Oct. 14, 2021

(30) Foreign Application Priority Data
Sep. 27, 2018 (EP) .................................. 18197353

(51) Int. Cl.
*H04L 1/00* (2006.01)
*H04L 1/06* (2006.01)
(Continued)

(52) U.S. Cl.
CPC .......... *H04L 1/0072* (2013.01); *H04L 1/0057* (2013.01); *H04L 1/0069* (2013.01);
(Continued)

(58) Field of Classification Search
CPC ... H04L 5/0055; H04L 1/1819; H04L 5/0094; H04L 1/0057; H04L 5/0078;
(Continued)

(56) References Cited

U.S. PATENT DOCUMENTS

2014/0185534 A1 7/2014 Vos et al.
2016/0373214 A1* 12/2016 Li ..................... H04W 74/0816
(Continued)

OTHER PUBLICATIONS

International Search Report and Written Opinion dated Jan. 3, 2020, received for PCT Application PCT/EP2019/075709 Filed on Sep. 24, 2019, 11 pages.
(Continued)

*Primary Examiner* — April Y Blair
*Assistant Examiner* — Sazzad Hossain
(74) *Attorney, Agent, or Firm* — Xsensus, LLP

(57) ABSTRACT

A communications device receive data from a wireless communications network by detecting from one or more control channels of a wireless access interface one or more encoded data units of a plurality of encoded data units into which an error correction encoded control information has been divided in accordance with an incremental redundancy scheme. The communications device decodes the error correction encoded control information by combining the one or more detected encoded data units in accordance with an arrangement of encoded bits of the error correction encoded control information in each of the plurality of encoded data units. Each of the plurality of encoded data units comprises a different set of the encoded bits according to a different redundancy version number of the incremental redundancy scheme.

18 Claims, 12 Drawing Sheets

(51) Int. Cl.
*H04L 1/18* (2006.01)
*H04L 5/00* (2006.01)
*H03M 13/00* (2006.01)

(52) U.S. Cl.
CPC .......... *H04L 1/0668* (2013.01); *H04L 1/1816* (2013.01); *H03M 13/6306* (2013.01); *H04L 1/0004* (2013.01); *H04L 1/1819* (2013.01); *H04L 5/0055* (2013.01); *H04L 5/0078* (2013.01); *H04L 5/0094* (2013.01)

(58) Field of Classification Search
CPC ... H04L 1/0072; H04L 1/0004; H04L 1/1816; H04L 1/0069; H04L 1/0668; H03M 13/6306
See application file for complete search history.

(56) References Cited

U.S. PATENT DOCUMENTS

| | | | |
|---|---|---|---|
| 2018/0062797 A1 | 3/2018 | Yang et al. | |
| 2019/0068326 A1* | 2/2019 | Sonobe | H04L 1/0018 |
| 2019/0158251 A1* | 5/2019 | Park | H04L 5/0055 |

OTHER PUBLICATIONS

TCL Communication, "PDCCH Combining Strategy", 3GPP TSG RAN WG1 Meeting #93, R1-1808255, Aug. 20-24, 2018, 6 pages.
Mediatek Inc., "Study and Evaluations of NR Control Channels for URLLC", 3GPP TSG RAN WG1 Meeting #94, R1-1808285, Aug. 20-24, 2018, 9 pages.
Sony, "L1 Enhancement on PDCCH for URLLC", 3GPP TSG RAN WG1 Meeting #95, R1-1812742, Nov. 12-16, 2018, 5 Pages.
Holma et al., "LTE for UMTS OFDMA and SC-FDMA Based Radio Access", John Wiley and Sons, 2009, pp. 25-27.
NTT Docomo Inc., "Revised WID on New Radio Access Technology", 3GPP TSG RAN Meeting #78, RP-172834, Dec. 18-21, 2017, 11 pages.
3GPP, "Study on Scenarios and Requirements for Next Generation Access Technologies", TR 38.913 V14.3.0, Jun. 2017, pp. 1-39.
Walewskiet al., "5G Communication for Automation in Vertical Domains", 3GPP, Mar. 14, 2017, pp. 1-2.
3GPP, "Feasibility study for Further Advancements for E-UTRA (LTE-Advanced)", TR 36.912 V9.3.0, Jun. 2010, pp. 1-61.
Gao, "SC-PTM, An Agile Broadcast/Multicast Mechanism" 3GPP, Available Online At: https://www.3gpp.org/more/1763-sc_ptm, Jan. 28, 2016, pp. 1-2.
3GPP, "Evolved Universal Terrestrial Radio Access (E-UTRA) and Evolved Universal Terrestrial Radio Access Network (E-UTRAN)", Stage 2, Release 13, TS 36.300 V13.14.0, Mar. 2020, pp. 1-313.
Chen et al., "Polar Coded HARQ Scheme with Chase Combining" Available Online At: https://arxiv.org/pdf/1310.6650.pdf, Jan. 10, 2014, 6 pages.

* cited by examiner

BLER of PDCCH repetition in the case of Rel-15 encoding scheme

BLER of PDCCH repetition in the case of proposed encoding scheme

BLER of PDCCH repetition in the case of proposed encoding scheme

INFRASTRUCTURE EQUIPMENT, COMMUNICATIONS DEVICE AND METHODS

CROSS-REFERENCE TO RELATED APPLICATIONS

The present application is based on PCT filing PCT/EP2019/075709, filed Sep. 24, 2019, which claims priority to EP 18197353.8, filed Sep. 27, 2018, the entire contents of each are incorporated herein by reference.

BACKGROUND

Field of Disclosure

The present disclosure relates to infrastructure equipment and communications devices, and methods for improving an integrity and/or reliability of communicating control information in wireless communications networks.

Please cancel the original Abstract at page 38 in its entirety and insert therefor the following replacement Abstract on a separate sheet as follows:

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Third and fourth generation mobile telecommunication systems, such as those based on the 3GPP defined UMTS and Long Term Evolution (LTE) architecture, are able to support more sophisticated services than simple voice and messaging services offered by previous generations of mobile telecommunication systems. For example, with the improved radio interface and enhanced data rates provided by LTE systems, a user is able to enjoy high data rate applications such as mobile video streaming and mobile video conferencing that would previously only have been available via a fixed line data connection. The demand to deploy such networks is therefore strong and the coverage area of these networks, i.e. geographic locations where access to the networks is possible, may be expected to increase ever more rapidly.

Future wireless communications networks will be expected to routinely and efficiently support communications with a wider range of devices associated with a wider range of data traffic profiles and types than current systems are optimised to support. For example it is expected future wireless communications networks will be expected to efficiently support communications with devices including reduced complexity devices, machine type communication (MTC) devices, high resolution video displays, virtual reality headsets and so on. Some of these different types of devices may be deployed in very large numbers, for example low complexity devices for supporting the "The Internet of Things", and may typically be associated with the transmissions of relatively small amounts of data with relatively high latency tolerance.

In view of this there is expected to be a desire for future wireless communications networks, for example those which may be referred to as 5G or new radio (NR) system/new radio access technology (RAT) systems, as well as future iterations/releases of existing systems, to support efficient connectivity for a wide range of devices associated with different applications and different characteristic data traffic profiles to support different services.

One example of a new service is referred to as Ultra Reliable Low Latency Communications (URLLC) services which, as its name suggests, requires that a data unit or packet be communicated with a high reliability and with a low communications delay. URLLC type services therefore represent a challenging example for both LTE type communications systems and 5G/NR communications systems.

The increasing use of different types of terminal devices associated with different traffic profiles gives rise to new challenges for efficiently handling communications in wireless telecommunications systems that need to be addressed.

SUMMARY OF THE DISCLOSURE

The present disclosure can help address or mitigate at least some of the issues discussed above.

Embodiments of the present technique can provide a method of operating a communications device to receive data from a wireless communications network, the method comprising detecting from one or more control channels of a wireless access interface one or more encoded data units of a plurality of encoded data units into which an error correction encoded control information has been divided in accordance with an incremental redundancy scheme, and decoding the error correction encoded control information by combining the one or more detected encoded data units in accordance with an arrangement of encoded bits of the error correction encoded control information in each of the plurality of encoded data units. Each of the plurality of encoded data units comprises a different set of the encoded bits according to a different redundancy version number of the incremental redundancy scheme. The combining the one or more detected encoded data units includes identifying each of the one or more encoded data units from physical resources on which the one or more encoded data units are detected to determine the redundancy version of each encoded data unit, identifying the arrangement of encoded bits of the error correction encoded control information in each of the one or more encoded data units based on the determined redundancy version, and combining the encoded bits from the one or more encoded data units in accordance with the incremental redundancy scheme. In one example, the control information is used to indicate resources of a shared channel of the wireless access interface via which downlink data is to be transmitted to the communications device.

Embodiments of the present technique can provide an arrangement in which an incremental redundancy scheme can be used to transmit control information which does not require explicit signalling to identify the encoded data units of each redundancy version number.

Embodiments of the present technique can provide an arrangement in which incremental redundancy is used to transmit error correction encoded control information, in which each of a plurality of encoded data units includes a different set of encoded bits of the control information and a communications device is configured to identify each of the encoded data units associated with a different redundancy version number to combine the encoded data units for decoding. The encoded data units associated with a different redundancy version number are identified from physical resources of a control channel from which the encoded data units are received. As a result a performance improvement can be achieved compared with using repeated transmission and chase combining.

Embodiments of the present technique, which further relate to infrastructure equipment, methods of operating communications devices and infrastructure equipment and circuitry for communications devices and infrastructure equipment, allow for an improvement in an integrity and reliability of data transmitted to communications devices, such as control information.

Respective aspects and features of the present disclosure are defined in the appended claims.

It is to be understood that both the foregoing general description and the following detailed description are exemplary, but are not restrictive, of the present technology. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings wherein like reference numerals designate identical or corresponding parts throughout the several views, and wherein.

DETAILED DESCRIPTION OF THE EMBODIMENTS

Long Term Evolution Advanced Radio Access Technology (4G)

Figure 1:
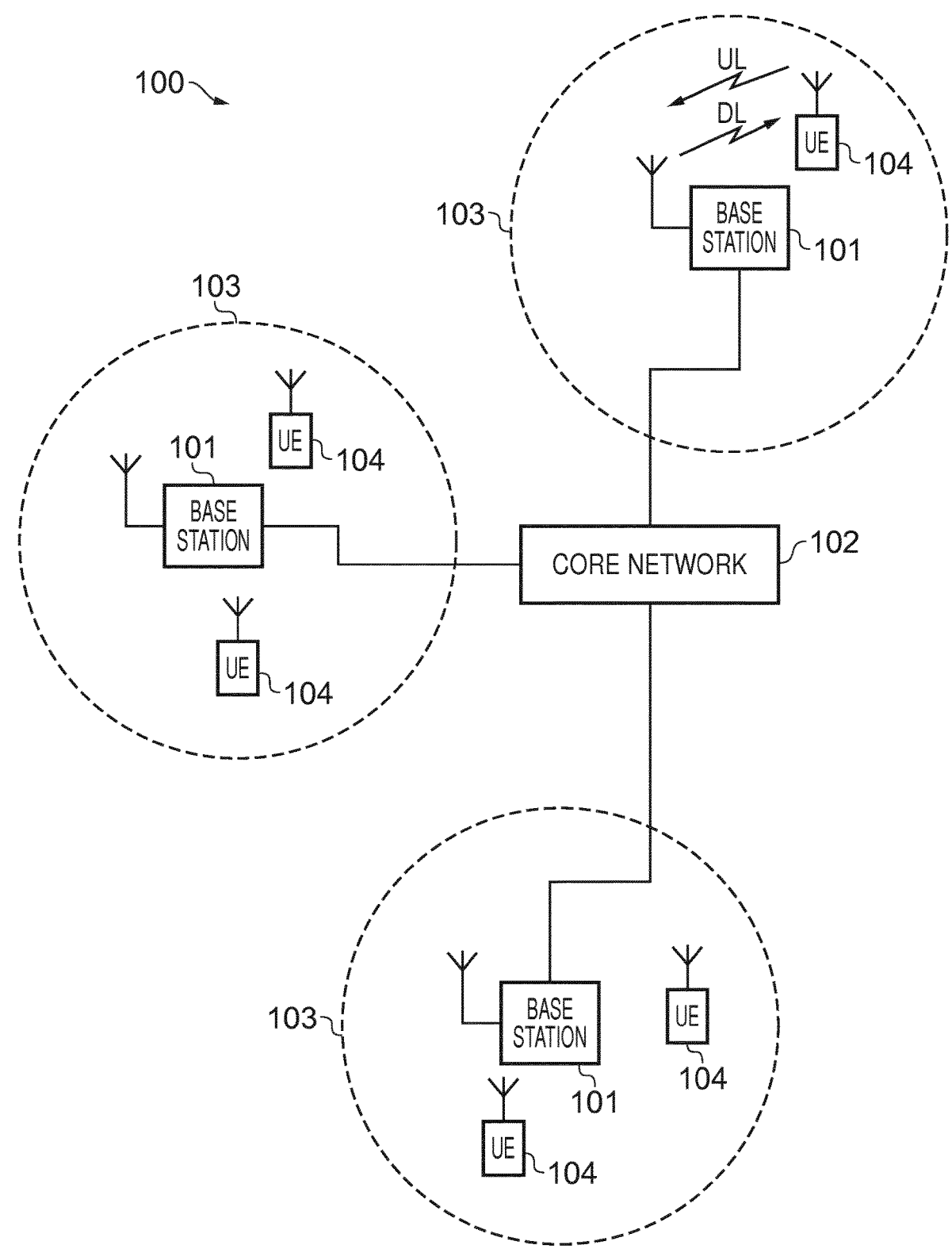
FIG. 1 schematically represents some aspects of an LTE-type wireless telecommunication system which may be configured to operate in accordance with certain embodiments of the present disclosure.

FIG. 1 provides a schematic diagram illustrating some basic functionality of a mobile telecommunications network/system 100 operating generally in accordance with LTE principles, but which may also support other radio access technologies, and which may be adapted to implement embodiments of the disclosure as described herein. Various elements of FIG. 1 and certain aspects of their respective modes of operation are well-known and defined in the relevant standards administered by the 3GPP (RTM) body, and also described in many books on the subject, for example, Holma H. and Toskala A [2]. It will be appreciated that operational aspects of the telecommunications networks discussed herein which are not specifically described (for example in relation to specific communication protocols and physical channels for communicating between different elements) may be implemented in accordance with any known techniques, for example according to the relevant standards and known proposed modifications and additions to the relevant standards.

The network 100 includes a plurality of base stations 101 connected to a core network part 102. Each base station provides a coverage area 103 (e.g. a cell) within which data can be communicated to and from communications devices 104. Data is transmitted from the base stations 101 to the communications devices 104 within their respective coverage areas 103 via a radio downlink. Data is transmitted from the communications devices 104 to the base stations 101 via a radio uplink. The core network part 102 routes data to and from the communications devices 104 via the respective base stations 101 and provides functions such as authentication, mobility management, charging and so on. Communications devices may also be referred to as mobile stations, user equipment (UE), user terminals, mobile radios, communications devices, and so forth. Base stations, which are an example of network infrastructure equipment/network access nodes, may also be referred to as transceiver stations/nodeBs/e-nodeBs, g-nodeBs (gNB) and so forth. In this regard different terminology is often associated with different generations of wireless telecommunications systems for elements providing broadly comparable functionality. However, example embodiments of the disclosure may be equally implemented in different generations of wireless telecommunications systems such as 5G or new radio as explained below, and for simplicity certain terminology may be used regardless of the underlying network architecture.

That is to say, the use of a specific term in relation to certain example implementations is not intended to indicate these implementations are limited to a certain generation of network that may be most associated with that particular terminology.

New Radio Access Technology (5G)

Figure 2:
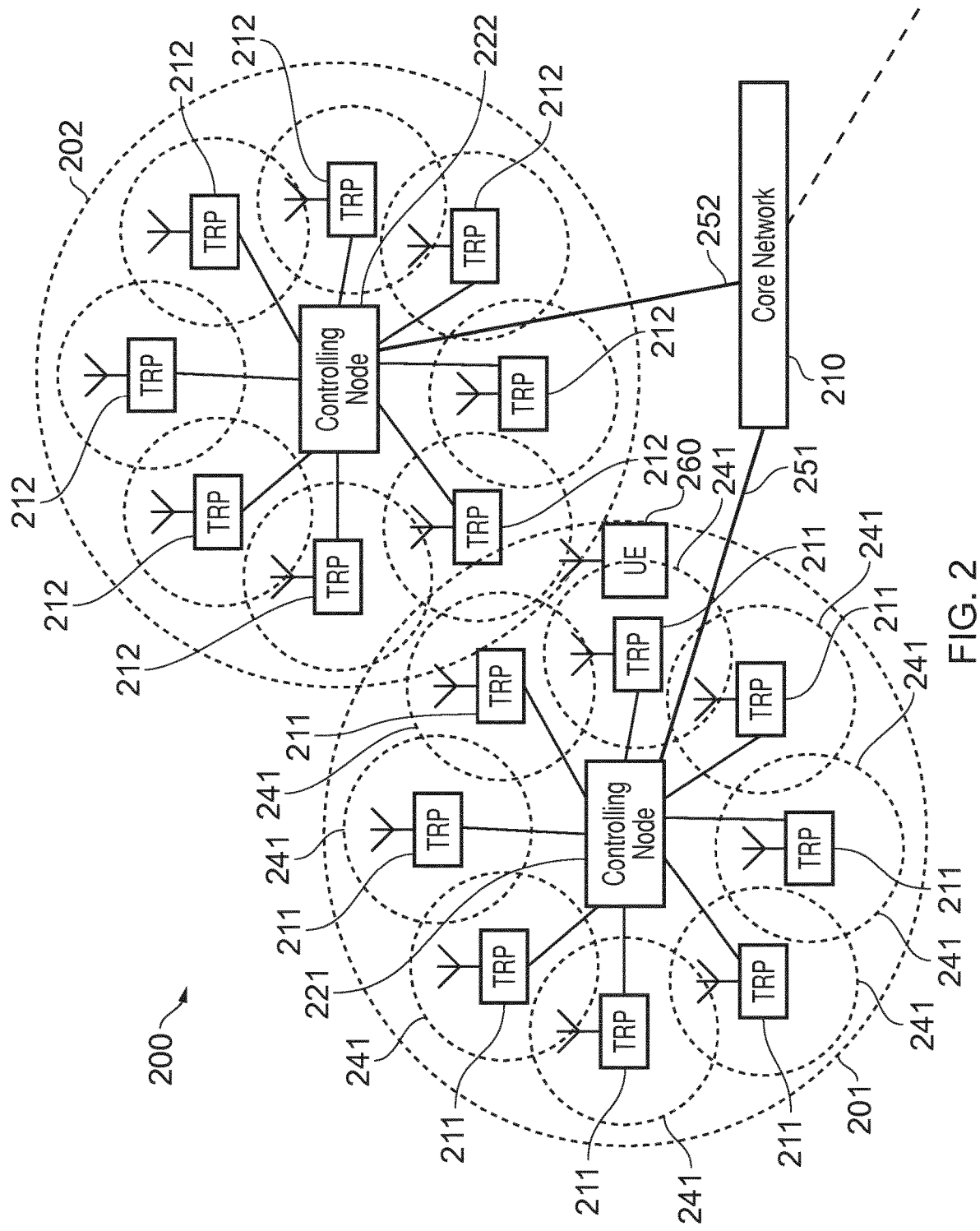
FIG. 2 schematically represents some aspects of a new radio access technology (RAT) wireless telecommunications system which may be configured to operate in accordance with certain embodiments of the present disclosure.

FIG. 2 is a schematic diagram illustrating a network architecture for a new RAT wireless communications network/system 200 based on previously proposed approaches which may also be adapted to provide functionality in accordance with embodiments of the disclosure described herein. The new RAT network 200 represented in FIG. 2 comprises a first communication cell 201 and a second communication cell 202. Each communication cell 201, 202, comprises a controlling node (centralised unit) 221, 222 in communication with a core network component 210 over a respective wired or wireless link 251, 252. The respective controlling nodes 221, 222 are also each in communication with a plurality of distributed units (radio access nodes/ remote transmission and reception points (TRPs)) 211, 212 in their respective cells. Again, these communications may be over respective wired or wireless links. The distributed units 211, 212 are responsible for providing the radio access interface for communications devices connected to the network. Each distributed unit 211, 212 has a coverage area (radio access footprint) 241, 242 where the sum of the coverage areas of the distributed units under the control of a controlling node together define the coverage of the respective communication cells 201, 202. Each distributed unit 211, 212 includes transceiver circuitry for transmission and reception of wireless signals and processor circuitry configured to control the respective distributed units 211, 212.

In terms of broad top-level functionality, the core network component 210 of the new RAT communications network represented in FIG. 2 may be broadly considered to correspond with the core network 102 represented in FIG. 1, and the respective controlling nodes 221, 222 and their associated distributed units/TRPs 211, 212 may be broadly considered to provide functionality corresponding to the base stations 101 of FIG. 1. The term network infrastructure equipment/access node may be used to encompass these elements and more conventional base station type elements of wireless communications systems. Depending on the application at hand the responsibility for scheduling transmissions which are scheduled on the radio interface between the respective distributed units and the communications devices may lie with the controlling node/centralised unit and/or the distributed units/TRPs.

A communications device 260 is represented in FIG. 2 within the coverage area of the first communication cell 201. This communications device 260 may thus exchange signalling with the first controlling node 221 in the first communication cell via one of the distributed units 211 associated with the first communication cell 201. In some cases communications for a given communications device are routed through only one of the distributed units, but it will be appreciated in some other implementations communications associated with a given communications device may be routed through more than one distributed unit, for example in a soft handover scenario and other scenarios.

In the example of FIG. 2, two communication cells 201, 202 and one communications device 260 are shown for simplicity, but it will of course be appreciated that in practice the system may comprise a larger number of communication cells (each supported by a respective controlling node and plurality of distributed units) serving a larger number of communications devices.

It will further be appreciated that FIG. 2 represents merely one example of a proposed architecture for a new RAT communications system in which approaches in accordance with the principles described herein may be adopted, and the functionality disclosed herein may also be applied in respect of wireless communications systems having different architectures.

Thus example embodiments of the disclosure as discussed herein may be implemented in wireless telecommunication systems/networks according to various different architectures, such as the example architectures shown in FIGS. 1 and 2. It will thus be appreciated the specific wireless communications architecture in any given implementation is not of primary significance to the principles described herein. In this regard, example embodiments of the disclosure may be described generally in the context of communications between network infrastructure equipment/access nodes and a communications device, wherein the specific nature of the network infrastructure equipment/access node and the communications device will depend on the network infrastructure for the implementation at hand. For example, in some scenarios the network infrastructure equipment/ access node may comprise a base station, such as an LTE-type base station 101 as shown in FIG. 1 which is adapted to provide functionality in accordance with the principles described herein, and in other examples the network infrastructure equipment/access node may comprise a control unit/controlling node 221, 222 and/or a TRP 211, 212 of the kind shown in FIG. 2 which is adapted to provide functionality in accordance with the principles described herein.

Figure 14:
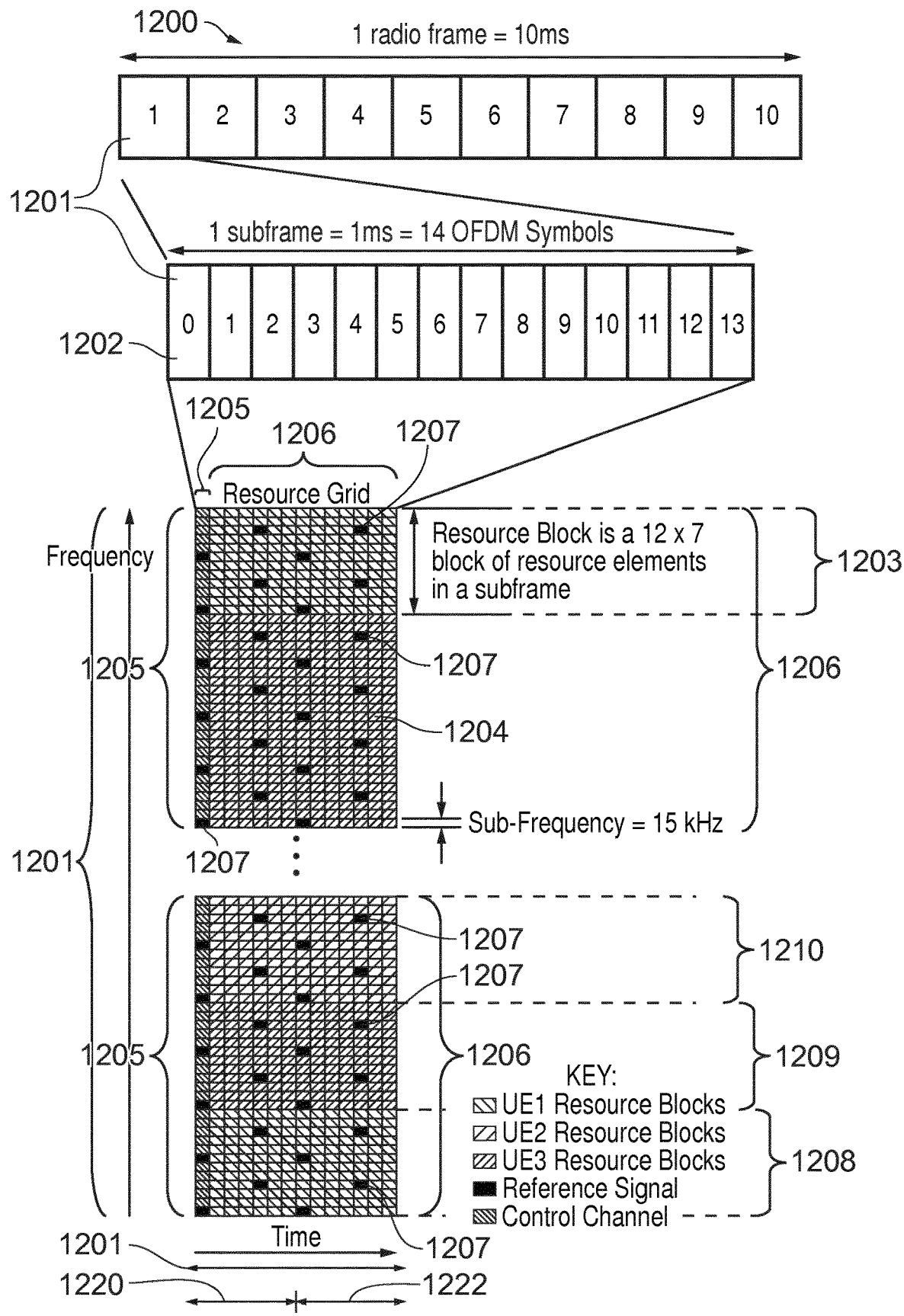
FIG. 14 is a schematic representation of a downlink of a wireless access interface according to the 3GPP LTE standard.
Figure 15:
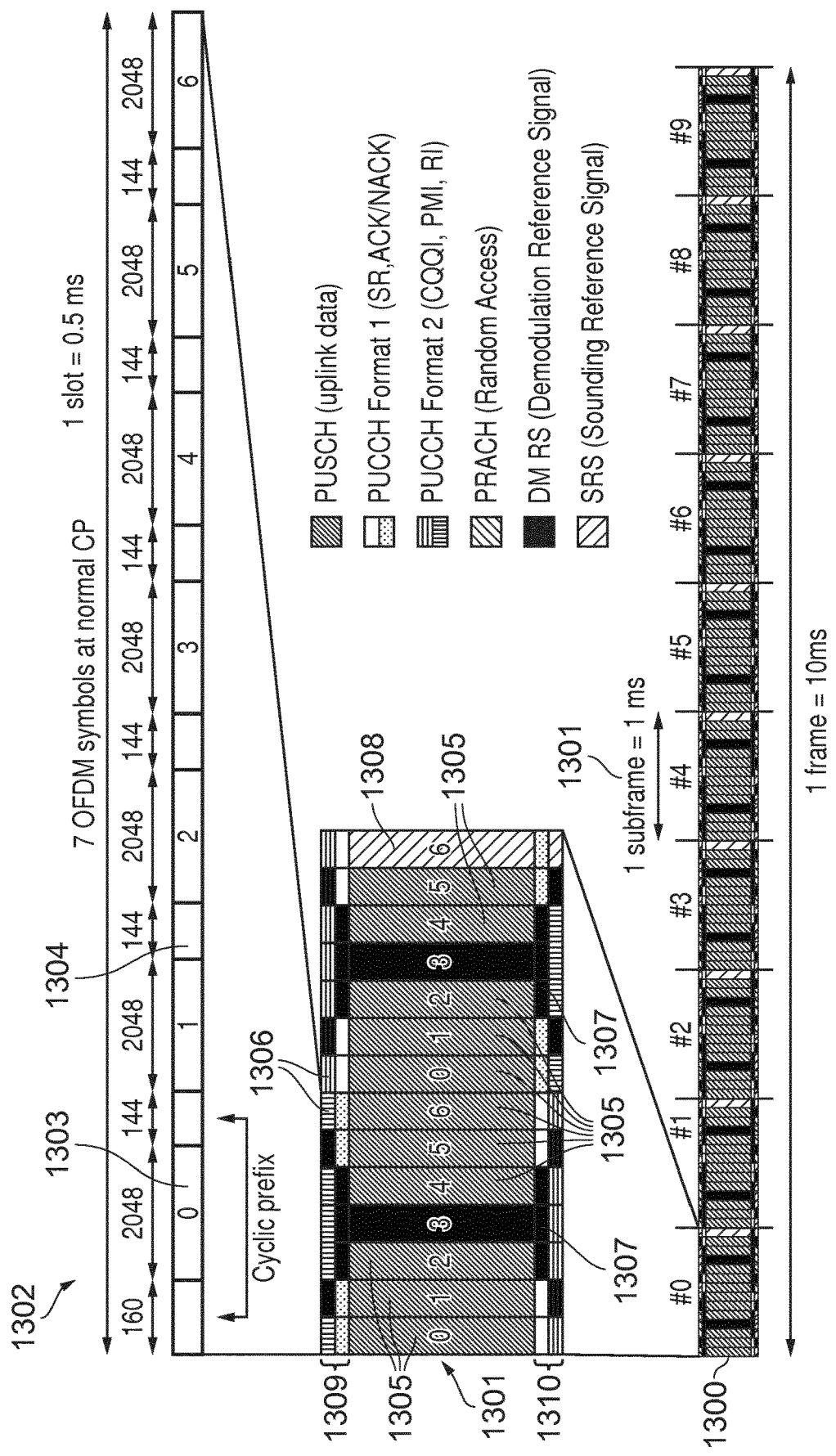
FIG. 15 is a schematic representation of an uplink of a wireless access interface according to the 3GPP LTE standard.

A wireless access interface in accordance with a 3GPP Standard for LTE is described in detail in Annex 1 in which FIGS. 14 and 15 provide detailed representation of a wireless access interface for the downlink and the uplink respectively. More details of the LTE wireless access interface are therefore described in Annex 1. However it will be appreciated that the wireless access interface provides physical communications resources including shared channels for both uplink and the downlink which may be accessed by communicating appropriate control signalling as those acquainted with LTE will appreciate. Equally a wireless access interface for the 5G Standard as represented in FIG. 2 may be similarly formed in accordance with the arrangement shown in Annex 1 and may use OFDM on the downlink and OFDM or SC-FDMA on the uplink. Of particular relevance for gaining a better understanding of embodiments described below is a structure of control channels which are used to convey control channel messages to UEs.

Figure 3:
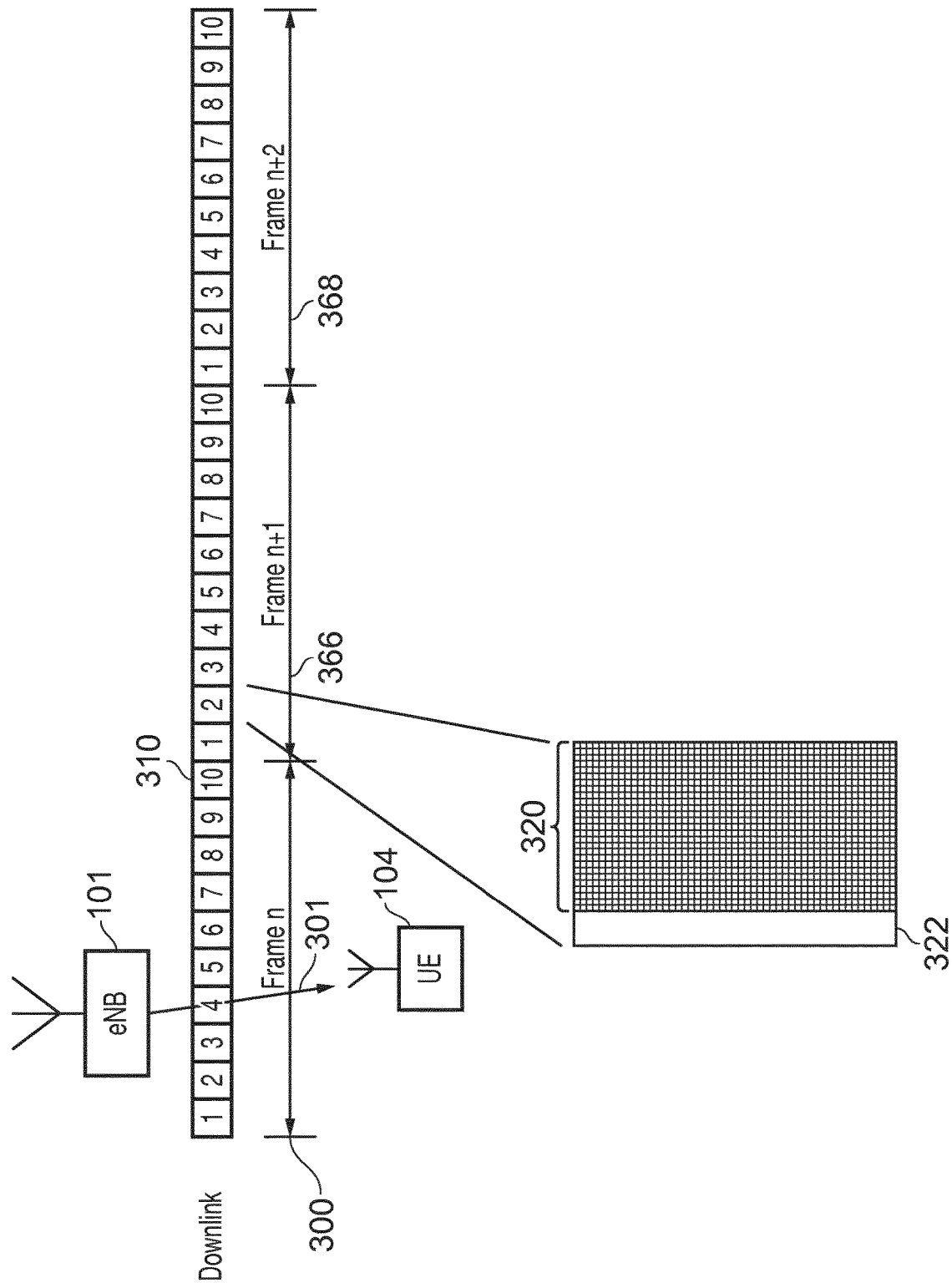
FIG. 3 is a schematic illustration of a simplified representation of a downlink of the wireless access interface shown in FIG. 14.

FIG. 3 provides a simplified representation of a downlink sub-frame structure based on the LTE wireless access interface structure shown in FIG. 14. FIG. 3 provides a simplified version in order to assist in the explanation of the example. As shown in FIG. 3, a downlink is shown to comprise three frames 300 within which a gNB 101 transmits signals 301 to a UE 104. Consistent with the explanation provided in Annex 1, the downlink comprises in each frame 300 ten sub-frames 310. An expanded view of the components of a sub-frame 310 are shown to include physical resources of a shared channel 320, referred to as PDSCH and physical resources which are dedicated to provide control channel elements (CCEs) 322, which are combined to form the physical resources used for a physical downlink control channel, PDCCH. As will be explained in the following paragraphs, control channel elements 322 are used to transmit control information which identifies the physical resources of the shared channel 320 on which the gNB 101 transmits data such as for example that conveyed by a URLLC message to the UE 104.

Example embodiments described below can find application with advanced wireless communications systems such as those referred to as 5G or New Radio (NR) Access Technology. The use cases that are considered for NR include:

Enhanced Mobile Broadband (eMBB)
Massive Machine Type Communications (mMTC)
Ultra Reliable & Low Latency Communications (URLLC) [2]

eMBB services are characterised by high capacity with a requirement to support up to 20 Gb/s. The requirement for URLLC is a reliability of $1-10^{-5}$ (99.999%) for one transmission of a 32 byte packet with a user plane latency of 1 ms [3]. Embodiments can find application particularly to URLLC, which has recently been proposed within 3GPP for 4G and 5G communications networks. In some examples, URLLC communications are either low latency (where the user plane latency target is 1 ms) or high reliability (where the acceptable error rate on URLLC transmissions is $10^{-5}$) or both low latency and high reliability (where both the latency and reliability targets need to be met at the same time).

It has now been proposed to provide a further improvement in the reliability and/or integrity of URLLC, and as a result Physical Layer Enhancements for NR URLLC for Release 16 of the 3GPP wireless access interface are being considered. These enhancements to URLLC (Ultra Reliable Low Latency Communications), include TDD and FDD. Research is therefore investigating an improvement for prioritized URLLC use cases (applications) and how to meet requirements for those use cases in Release 16 with higher requirements, such as a higher reliability (up to 1E-6 level), higher availability, time synchronization down to the order of a few μs where the value can be 1 or a few μs depending on frequency range, short latency in the order of 0.5 to 1 ms. The requirements depend on the use case at hand, with use example cases including factory automation, transport industry and electrical power distribution. One of the main enhancements is a reliability improvement for the control channel and data channel. More particularly, in respect of the example embodiments described below, communicating control information such as the downlink control information to the UE via the PDCCH (target reliability of Rel-16 eURLLC is $1-10^{-6}$ (=99.9999%) presents a technical problem with which the described embodiments find application.

Improvement in or Relating to DL Control Information Communication Aspects of the 5G or new radio (NR) wireless access interface have a structure which is similar to that of the 3GPP LTE standard. A PDCCH (physical downlink control channel) can be used to carry a grant to schedule DL transmissions on PDSCH and UL transmissions on PUSCH, where the grant is contained in a Downlink Control Information (DCI).

According to some examples a UE is configured to monitor a set of PDCCH candidates in the configured monitoring occasions in one or more configured COntrol REsource SETs (CORESETs) according to the corresponding search space configurations. A CORESET consists of a set of PRBs in the frequency domain with a time duration of 1 to 3 OFDM symbols, which is similar to the example of an LTE wireless communications interface. The resource units for the PDCCH, called Resource Element Groups (REGs) and Control Channel Elements (CCEs), are defined within a CORESET with each CCE consisting of a set of REGs. A CORESET contains a number of CCEs. The CCE consists of six resource-element groups (REGs) where a resource-element group equals one resource block (RB) during one OFDM symbol. The RB is defined as 12 consecutive subcarriers in the frequency domain. The PDCCH is formed by an aggregation of CCEs. Interleaved and non-interleaved CCE-to-REG mappings are supported in a CORESET. Each resource element group carrying PDCCH carries its own demodulation reference symbols (DMRS) with the modulation scheme being QPSK.

One aspect of the communication of the eURLLC whose reliability and/or integrity can be improved is the transmission of control information indicating the shared channel resources of the PDSCH or PUSCH on which the eURLLC is to be transmitted, where the control information is transmitted as downlink control information (DCI). To this end, one technique which can be used to improve a likelihood of correctly detecting the PDCCH information is repetition. For PDCCH repetition, one control information message such as downlink control information (DCI) is transmitted by multiple PDCCHs in the time domain, the frequency domain and/or a code domain and so on. The repeated PDCCHs can then be soft combined at the UE to improve a likelihood of correctly detecting the PDCCH.

However, current encoding techniques for the PDCCH have not been specifically designed for repeated transmission. When the transmission scheme includes repeated transmission the encoding scheme includes puncturing (if the number of physical bits available in the PDCCH is less than the number of physical bits in the mother code) and repeating (if the number of physical bits available in the PDCCH is more than the number of physical bits in the mother code). An example of a transmitter is shown in FIG. 4 with a corresponding receiver for control information shown in FIG. 5.

Figure 4:
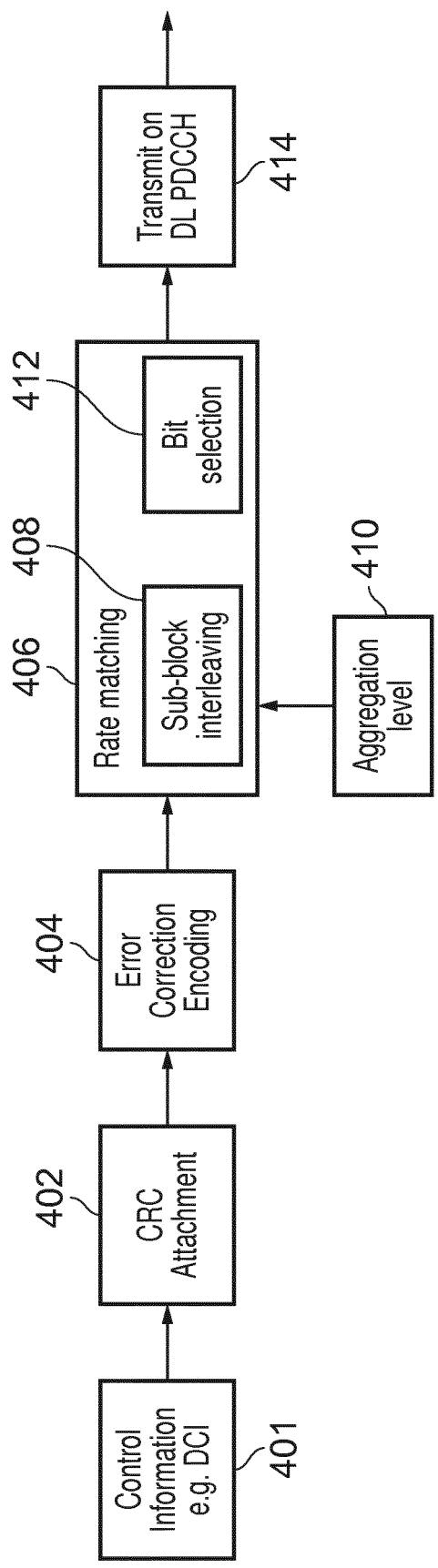
FIG. 4 is a schematic block diagram of an example transmitter configured to transmit control information using repeated transmission and a number of aggregation levels.

As shown in FIG. 4, control information such as downlink control information (DCI) is formed in a block 401 and passed to a CRC attachment block 402. The CRC attachment block calculates a cyclic redundancy check (CRC) on the data of the control information before passing the combined CRC parity check bits and symbols representing the control information to an error correction encoder 404. The error correction encoder encodes the control information with the CRC bits to form an error correction encoded code word for transmission on the control channel elements of the downlink 322. The error correction encoded code word is then received by a rate matching block 406 which includes a sub interleaving block 408 and a bit selection block 412, which are explained in more detail below. The sub-block interleaving 408 performs interleaving within blocks of data that is used to transmit the encoded code word. The aggregation level is forwarded to the rate matching block 406 from a unit 410 Based on the aggregation level, the bit selection function determines which of the sub-block-interleaved bits are to be transmitted. The number of physical bits that convey the PDCCH is calculated based on the aggregation level, number of CCEs and number of physical bits per CCE. When the aggregation level is high, such that the number of encoded bits is less than the number of physical bits that convey the PDCCH, the bit selection function repeats some of the sub-block-interleaved bits. When the aggregation level is low, such that number of encoded bits is greater than the number of physical bits that convey the PDCCH, the bit selection function punctures some of the sub-block-interleaved bits. The whole PDCCH may also be repeated, according to a number of repetitions: in this case, the processing chain of FIG. 4 is re-applied for each repetition. Essentially the transmitter of the PDCCH repeatedly transmits the same physical bits in each repetition.

Figure 5:
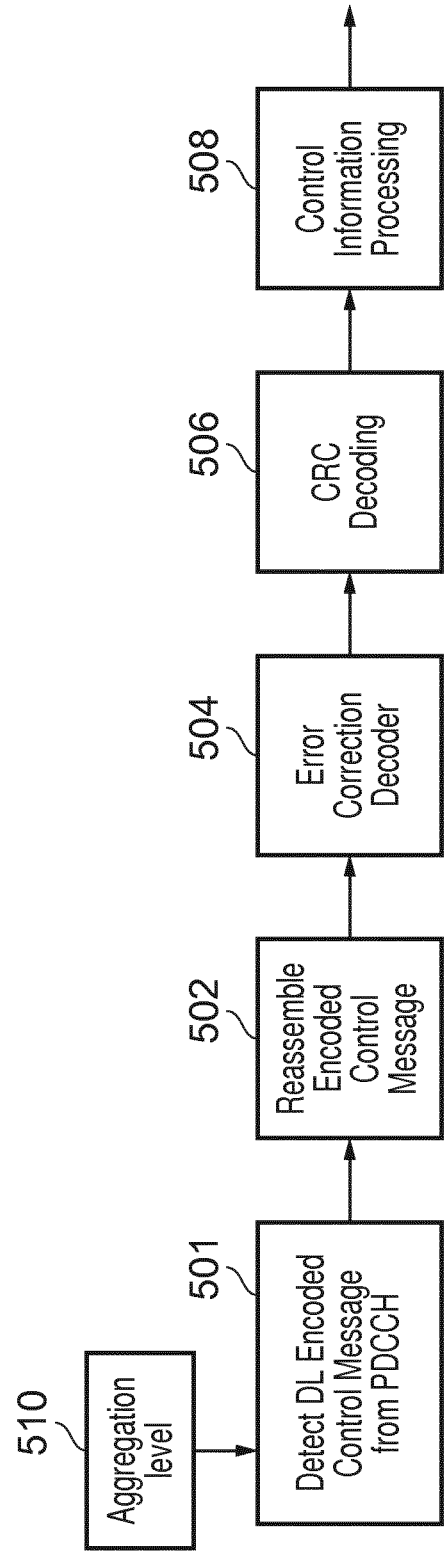
FIG. 5 is a schematic block diagram of an example receiver configured to receive control information transmitted by the transmitter of FIG. 4 using repeated transmission and a number of aggregation levels.

A corresponding receiver for receiving encoded control information transmitted by the transmitted chain showing in FIG. 4, is showing in FIG. 5. As shown in FIG. 5 a detection block 501 detects the units of data transmitted in the PDCCH on the CORESET on the downlink from the gNB in accordance with an aggregation level received from an input 510 corresponding to the aggregation level at the transmitter 410. According to the aggregation level, the detected encoded control information is received at a reassembling block 502 which reassembles the control information which is sent to the error correction decoder 504 for decoding in accordance with the error correction encoding scheme being used at the transmitter. If the whole PDCCH is repeated, the repeated receptions of the PDCCH can be soft-combined in the reassembling block 502, where soft-combination can comprise addition of log-likelihood ratios (LLRs) for received soft bits of the repetitions. CRC decoding is then performed by a CRC decoder 506 in accordance with a conventional arrangement to detect whether the control information has been correctly received which outputs to a control information processing block 508, the control information which is then used by the UE 104 to for example receive the downlink data from the shared channel resources (PDSCH). For example, based on the received bit streams from the control information, the UE determines what it has to do (e.g. receive a PDSCH). The control information processing block 508 therefore includes some sort of parsing/processing function.

An example of a forward error correction (FEC) code performed by the error correction encoder 404, which can be used to improve the integrity of control information communicated by the PDCCH is polar coding. The DCI is encoded by the Polar coding and then the PDCCH containing the encoded DCI is transmitted to a UE or UEs.

Different code rates for the control channels are realized by aggregating different numbers of CCE and rate matching to the amount of resource in that number of CCEs. The number of aggregated CCE is called the aggregation level (AL), which proportionally provides a greater amount of physical resource with the increase in the aggregation level. According to an example 5G or new radio standard referred to as release 15 (Rd-15), the supported aggregation levels are 1, 2, 4, 8, and 16. For example, AL16 means the number of aggregated CCEs for PDCCH is 16, and the PDCCH consists of 16 CCEs. Accordingly, the aggregation level defines the number of CCEs that can be used to convey encoded control information.

Returning to FIGS. 4 and 5, the example transmitter includes the CRC attachment block 402 and the receiver includes a CRC decoder 506. A CRC (Cyclic redundancy check) is attached to the control information message such as a DCI, where the CRC consists of a set of parity bits. The CRC parity bits are calculated based on the DCI, for example the number of CRC parity bits is 24 bits. A portion of the CRC parity bits are scrambled by a 16 bit Radio network temporary identifier (RNTI). Here the total number of bits in the CRC-attached DCI (called information bits) is K bits.

The CRC-attached DCI is encoded by Polar coding in the error correction encoding block 404. After encoding, N encoded bits are generated. Here the set of encoded bits is called a mother code. The number of the encoded bits (i.e. N) is determined by the following, where E is the rate matching output sequence length (the number of bits produced by the rate-matching block) and n_max=9:

$$\text{If } E \leq (9/8) \cdot 2^{(\lceil log_2 E \rceil - 1)} \text{ K} / E < 9/16$$
$$n_1 = \lceil log_2 E \rceil - 1;$$
$$\text{else}$$
$$n_1 = \lceil log_2 E \rceil;$$
$$\text{end if}$$
$$R_{min} = 1/8;$$
$$n_2 = \lceil log_2 (K / R_{min}) \rceil;$$
$$n = \max \{\min\{n_1, n_2, n_{max}\}, n_{min}\}$$
$$\text{where } n_{min} = 5.$$
$$N = 2^n$$

That is, the above set of rules indicates that the number of the encoded bits is determined by at least the number of information bits (i.e. K) and the rate matching output sequence length (i.e. E).

In the rate matching block, the N encoded bits are sub-block-interleaved by dividing the N encoded bits into 32 sub-blocks and using a given sub-block interleaver pattern, which is specified in advance.

The sub-block interleaved bits, of length N bits, are bit-selected (rate-matched) to the rate matching output sequence length (i.e. E).

For the bit selection, the sub-block interleaved bits are written into a circular buffer of length N. Denoting by E the rate matching output sequence length, the bit selection output bit sequence is generated as follows:

```
if E ≥ N    -- repetition
  for k = 0 to E −1
    e_k = y_{mod(k,N)};
  end for
else
  if K / E ≤ 7 / 16   -- puncturing
    for k = 0 to E −1
      e_k = y_{k+N−E};
    end for
  else         -- shortening
    for k = 0 to E −1
      e_k = y_k ;
    end for
  end if
end if
```

Previously proposed examples for transmitting the control information (for example Release-15 of 5G/NR) can support aggregation levels of 1, 2, 4, 8 and 16. The corresponding rate matching output sequence lengths (i.e. E) are 108, 216, 432, 864 and 1728, respectively. Based on these output sequence lengths, the number of the encoded bits (i.e. N) is 128, 256, 512, 512 and 512, respectively. That is, the rate matching output sequences for aggregation level=8 and 16 are generated by repetition of the mother code, while the rate matching output sequence for aggregation level=1, 2 and 4 are generated by puncturing or shortening of the mother code. Here the mother code is the same among aggregation level=4, 8 and 16.

A known technique for improving a likelihood of communicating data correctly and therefore improving an integrity and/or reliability of the data is to transmit the same data repeatedly. A receiver detecting the transmitted data can use so called chase combining to improve the likelihood of correctly detecting the data. According to this technique, since the same blocks of data are retransmitted, the receiver can combine the same encoded data symbols of each of the retransmitted blocks by effectively adding the encoded symbols together before decoding. The combination can alternatively be performed by LLR combining received physical bits (having received encoded symbols and from those received symbols having generated LLRs).

Figure 6:
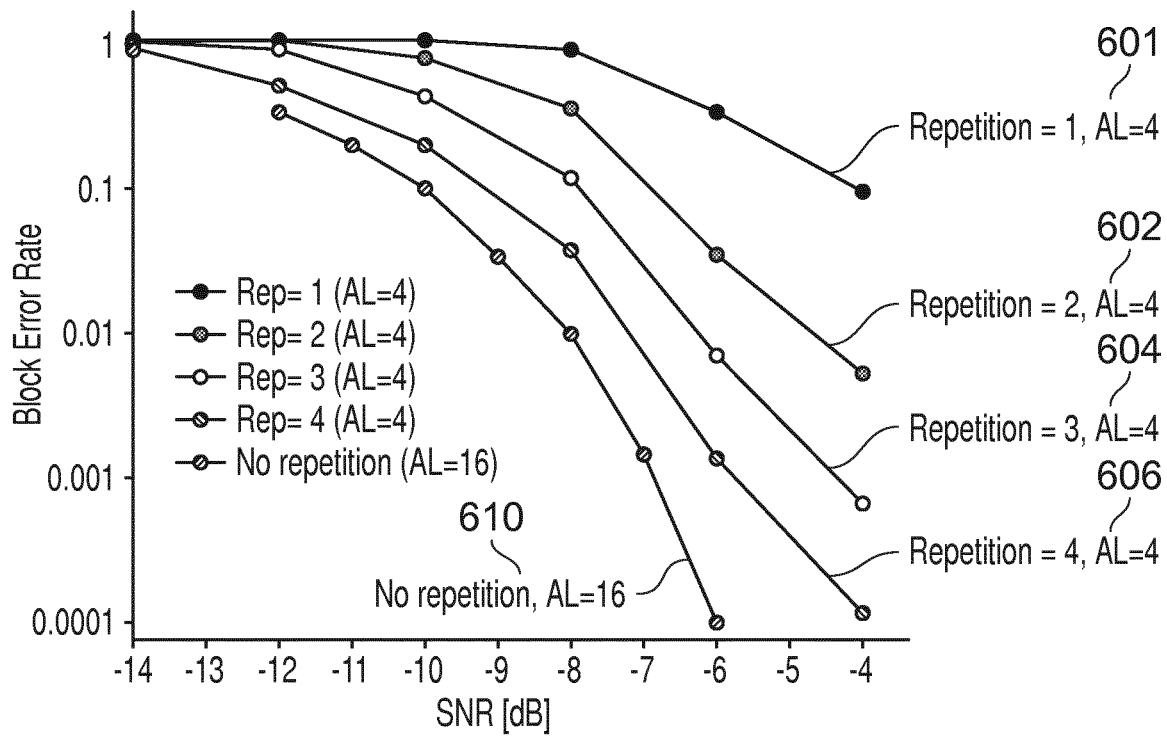
FIG. 6 is a set of graphical plots of block error rate against signal to noise ratio for different repetition numbers and aggregation levels.

It has been identified that if repetition is applied to the transmission of control information using the PDCCH with the presently proposed encoding scheme of Polar encoding with chase combining with the aggregation levels according to a conventional PDCCH transmission, then the potential coding gain is not achieved in some cases. For example, FIG. 6 shows block error rate (BLER) simulation of PDCCH repetition in the case of the chase combining scheme. A first graphical plot 601 provides a plot of BLER against signal to noise ratio for a repetition level of one, that is of one repetition of the control information with an aggregation level of 4, the aggregation level partly determining the number of available control channel elements. A second graphical plot 602 provides a repetition level two with an aggregation level of four and a third curve 604 a repetition level of three with an aggregation level of four, a fourth graphical plot with a repetition level of four and an aggregation level of four 606 and a graphical plot 610 for no repetition level for an aggregation level 16.

According to the results shown in FIG. 6 for PDCCH with aggregation level 4 (AL4) and repeated transmission, the maximum repetition is 4 and the repeated transmissions are soft-combined at the UE. As a reference, the performance of PDCCH with AL16 and with no repetition is also shown 610. Here the same amount of physical resource for the PDCCH is used for both the cases of AL4 with four repetitions and AL16 with no repetition (i.e. 16 CCEs in both cases). Therefore the BLER performance could be the same theoretically, given that the overall coding rate is the same for both cases, but the BLER of AL4 with four repetitions is worse than the BLER of AL16 with no repetition. The degradation occurs due to the current encoding scheme, where the current encoding scheme supports chase combining. Therefore the encoding scheme for PDCCH needs to be enhanced for optimal support of repetition.

In FIG. 6, the same PDCCHs of aggregation level=4 are repeated. Since the puncturing pattern is the same among the repeated PDCCHs, the punctured bits (unused bits) in the mother code are also the same. On the other hand, the PDCCH of aggregation level=16 is generated by repetition of the mother code, which naturally occurs in the circular buffer of the bit selection block 412. For the PDCCH of aggregation level=16, none of the mother code bits are punctured, whereas for the PDCCH of aggregation level=4, some of the mother code bits are punctured (i.e. unused for over the air transmission). Therefore, the performance degradation in FIG. 6 occurs due to the punctured (unused) bits. This affects the PDCCH reliability when the PDCCH is repeated, in which for the example of a conventional transmitter of FIG. 4 the whole of the processing chain is re-executed.

Introducing IR (Incremental Redundancy) for PDCCH Repetition

Embodiments of the present technique can provide an improvement in the integrity and reliability of control information communicated via control channel resource elements using incremental redundancy. As such a reliability and integrity of control information communicated via the PDCCH using a repetition encoding scheme can be improved with respect to known arrangements such as that proposed for Release-15 of NR for example.

According to example embodiments a method of operating a communications device to receive data from a wireless communications network comprises detecting from one or more control channels of a wireless access interface one or more encoded data units of a plurality of encoded data units into which an error correction encoded control information has been divided in accordance with an incremental redundancy scheme, and decoding the error correction encoded control information. The error correction encoded control information is decoded by combining the one or more detected encoded data units in accordance with an arrangement of encoded bits of the error correction encoded control information in each of the plurality of encoded data units. Each of the plurality of encoded data units comprises a different set of the encoded bits according to a different redundancy version number of the incremental redundancy scheme. The combining the one or more detected encoded data units includes identifying each of the one or more encoded data units from physical resources on which the one or more encoded data units are detected to determine the redundancy version number of each encoded data unit, identifying the arrangement of encoded bits of the error correction encoded control information in each of the one or more encoded data units based on the determined redundancy version number, and combining the encoded bits from the one or more encoded data units in accordance with the incremental redundancy scheme. In one example, the control information is used to indicate resources of a shared channel of the wireless access interface via which downlink data is to be transmitted to the communications device.

The control information communicated using the incremental redundancy scheme may therefore provide control information indicating resources of a shared channel on which downlink data is transmitted to the UE, but the control information can provide other information. For example the control information can be used for example:

To signal to the UE that it should transmit on uplink resources, such as on the Physical Uplink Shared Channel (PUSCH);

To send a PDCCH order to the UE;

To send timing advance commands to the UE.

Embodiments of the present technique can therefore be characterised by

Introducing incremental redundancy (IR) for PDCCH repetition

Recognize a redundancy version providing blocks of encoded bits which are different depending on the redundancy version (RV) used for the PDCCH repetition using incremental redundancy Dynamic switching between the PDCCH repetition schemes using CC (chase combining) and IR (incremental redundancy)

It is known to provide an incremental redundancy scheme as an alternative to repetition and chase combining [8]. However embodiments of the present technique provide a scheme for communicating control information effectively using incremental redundancy, whilst reducing any additional signalling overhead to identify versions of redundant control information.

An illustrative embodiment of the present technique will now be explained with reference to FIG. 7 which shows a schematic block diagram of an gNB 701 communicating with a UE 702 via a wireless access interface illustrated generally by arrow 704 via a wireless access interface corresponding for example to the downlink shown in FIG. 3. As with FIGS. 1 and 2, the gNB 701 is connected to a core network 102 via an interface 710 to a controller 712. The gNB 701 includes a receiver 714 connected to an antenna 716 and a transmitter 718 connected to the antenna 716. Correspondingly, a UE 702 includes a controller 720 connected to a receiver 722 which receives signals from an antenna 724 and a transmitter 726 also connected to the antenna 724.

Figure 7:
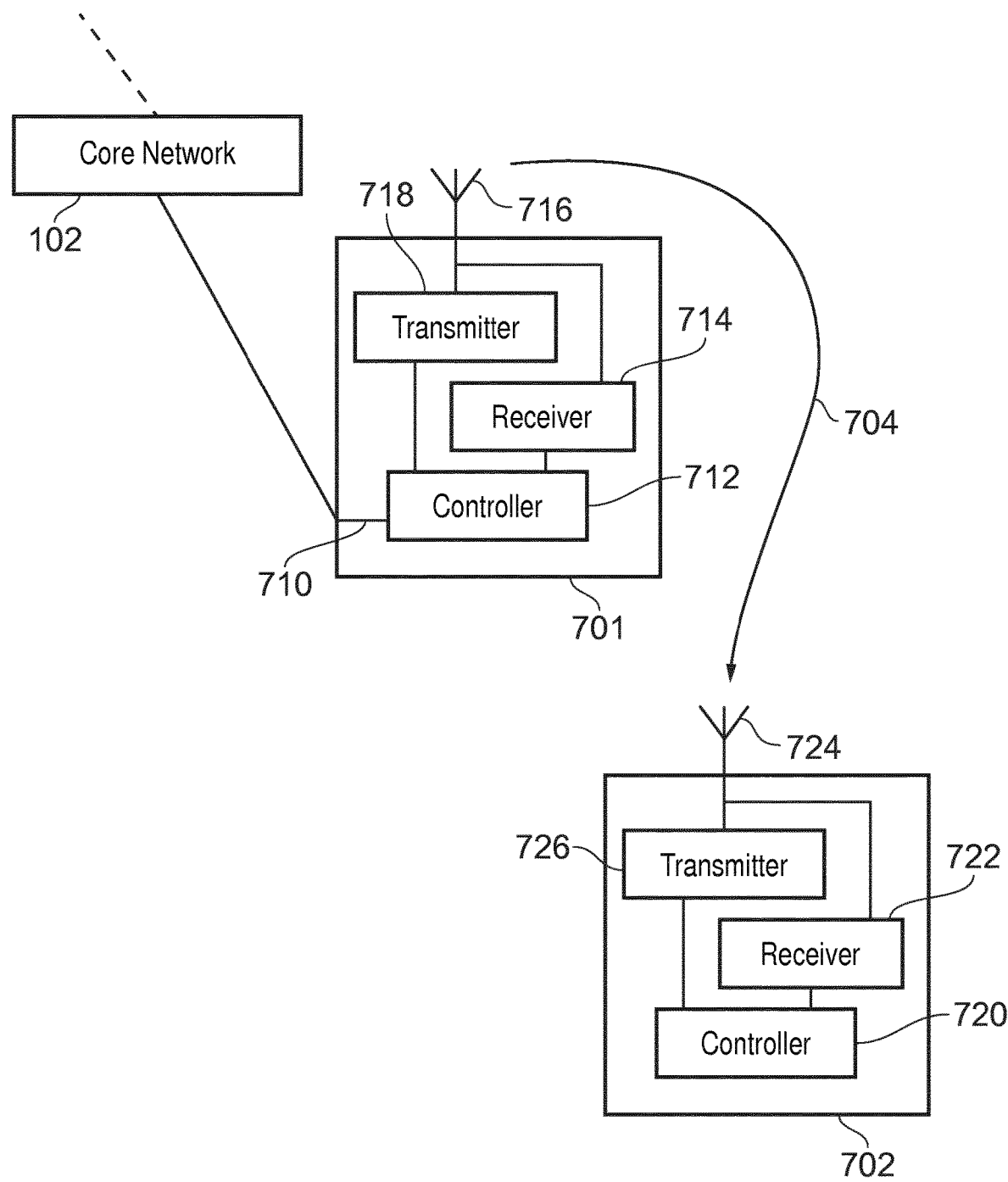
FIG. 7 is a schematic block diagram of an example infrastructure equipment and communications device configured in accordance with example embodiments.
Figure 8:
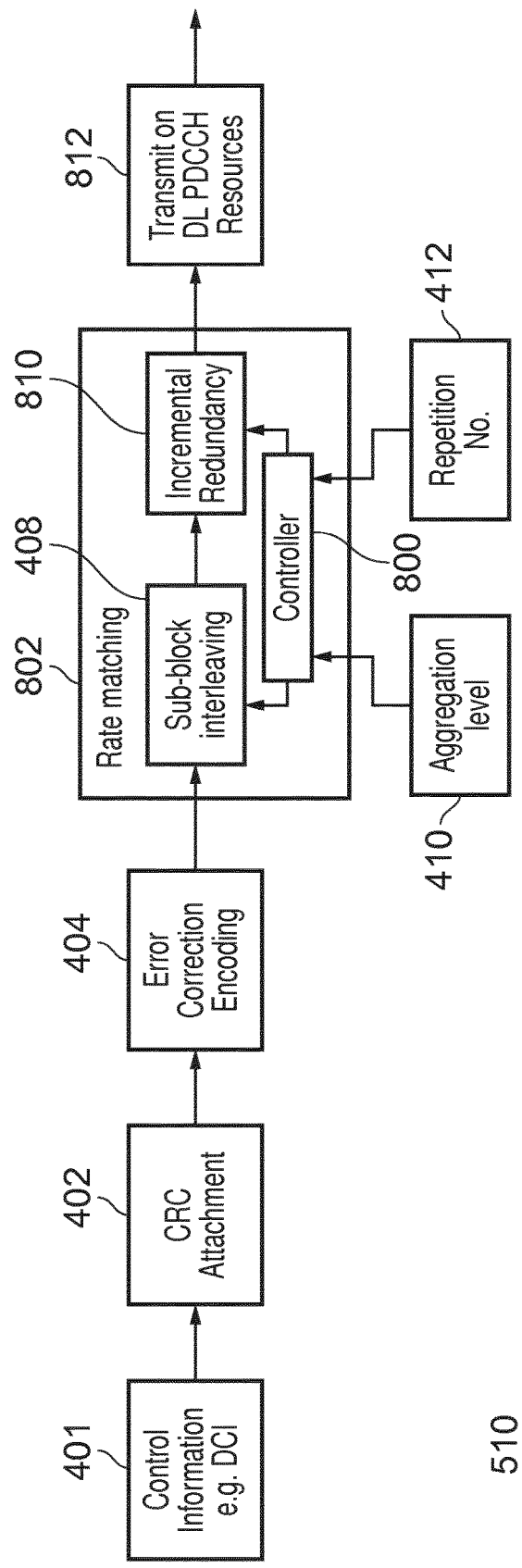
FIG. 8 is a schematic block diagram of an example transmitter configured to transmit control information using an incremental redundancy scheme and a number of aggregation levels according to example embodiments.

A schematic block diagram of a transmitter providing one example implementation of the transmitter 718 of the gNB 701 shown in FIG. 7 is shown in FIG. 8. A corresponding receiver block diagram of the receiver 722 of the UE 702 of FIG. 7 is shown in FIG. 9.

Figure 9:
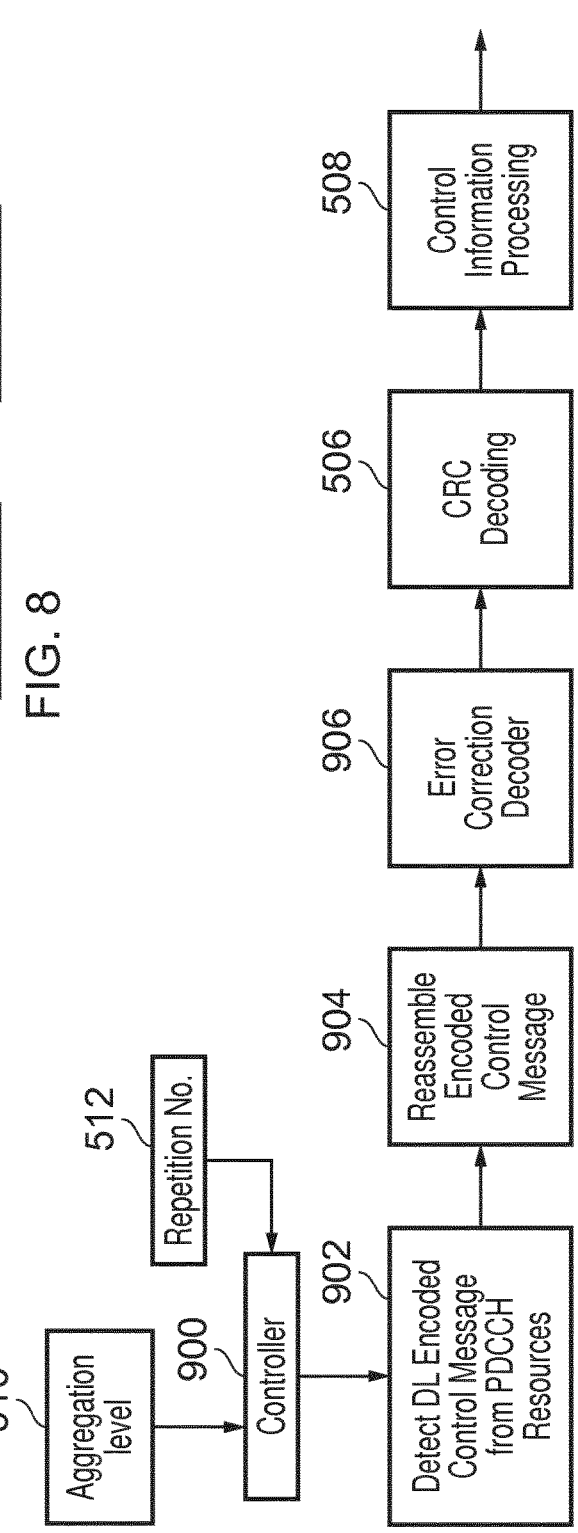
FIG. 9 is a schematic block diagram of an example receiver configured to receive control information transmitted by the transmitter of FIG. 8 according to an incremental redundancy scheme and a number of aggregation levels according to example embodiments.

The schematic block diagrams shown in FIGS. 8 and 9 for the transmitter 718 and the receiver 722 respectively correspond to those shown in FIGS. 4 and 5 adapted to illustrate example embodiments. Accordingly only the differences with respect to the schematic block diagram shown in FIGS. 4 and 5 will be described.

As for the transmitter shown in FIG. 4, FIG. 8 includes a control information generating block 401, a CRC attachment block 402 and an error correction encoding block 404. As shown in FIG. 8 the aggregation level input 410 and the repetition number input 816 are received by a controller 800 forming part of a rate matching block 802. The sub-block interleaving 408 operates in a similar way to that shown in FIG. 4 in that it provides an arrangement for interleaving between blocks which are transmitted via the control channel elements of the wireless access interface. However, as shown in FIG. 8 the rate matching block 802 includes an incremental redundancy block 810 which receives the sub-block interleaving output 408 as an error correction code word for transmission via the PDCCH physical resources (or CORESET physical resources) by the transmitter 812.

In accordance with the present technique, the incremental redundancy block 810 is arranged to transmit the error correction encoded control information on the PDCCH resources as encoded data units which have incremental redundancy or a different arrangement of redundancy from other encoded data units, which can be referred to as redundancy versions, because each of the encoded data units is associated with a different redundancy version number of the incremental redundancy scheme.

A corresponding block diagram for a receiver is shown in FIG. 9. As shown in FIG. 9, the aggregation level input and the repetition number input 512 are received by a controller 900. The controller 900 applies the aggregation level and repetition number to form a candidate of a search space of the PDCCH resources on which the control information may hypothetically have been transmitted, which is then fed to a detector 902. The detector 902 is configured to detect the encoded data units corresponding to different redundancy versions transmitted via the PDCCH resources by the transmitter 812. A block 904 then reassembles the encoded control message combining different arrangements of the encoded data bits from each of the encoded data units corresponding to different redundancy version numbers to reform an error correction code word which is then decoded by an error correction decoder 906. The error correction decoder 906 decodes the encoded code words or code words and generates an estimate of the control information. The CRC decoding block 506 performs a CRC check to confirm that the data has been correctly received and the control information processing block 508 performs the same operations as explained above with reference to FIG. 5 and so further explanation is unnecessary.

Figure 10:
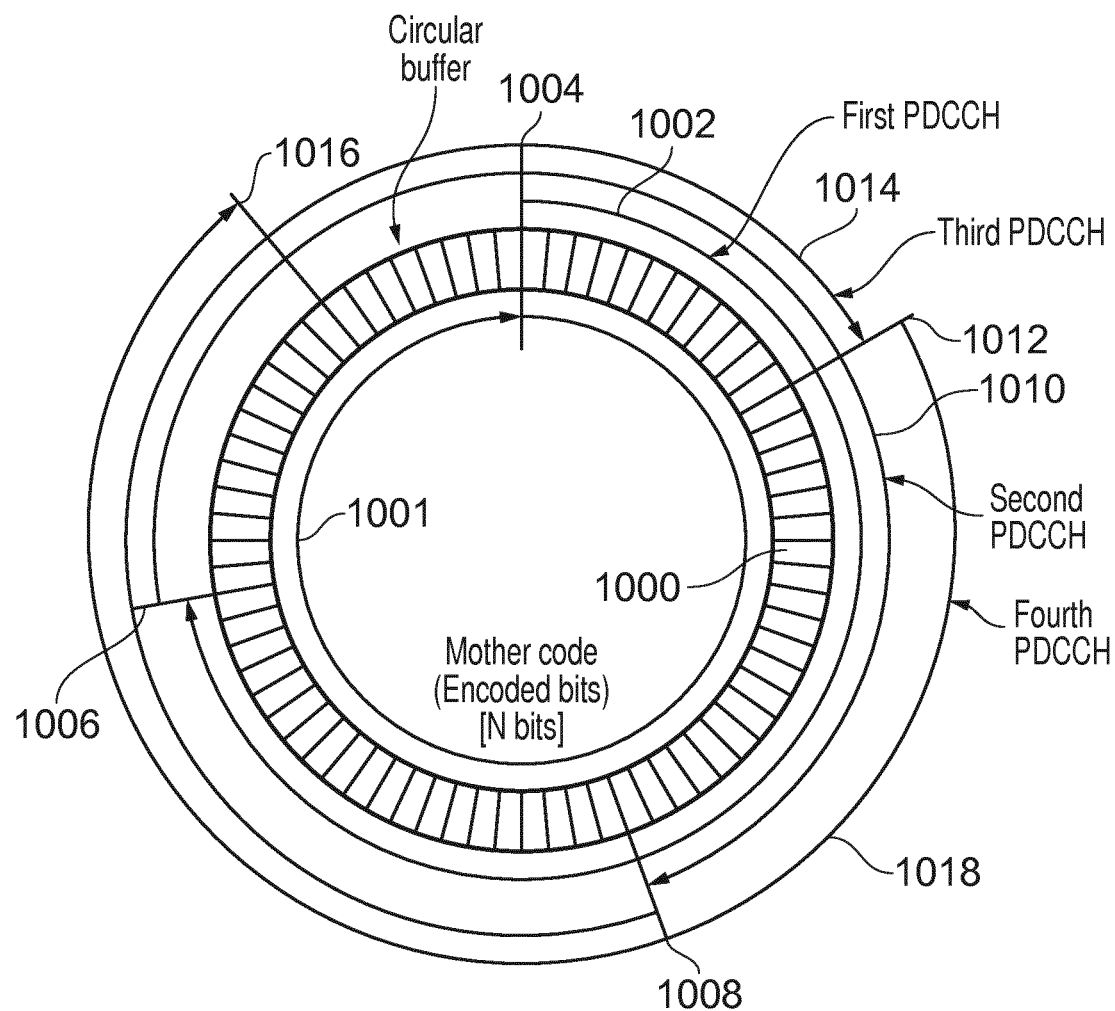
FIG. 10 is a schematic representation of a circular buffer used to form redundancy versions of encoded control information according to an example embodiment.

Embodiments of the present technique can provide an arrangement where an incremental redundancy scheme is used in order to avoid puncturing bits in the mother code when repetition is used for transmitting control information via the PDCCH. In order to implement the incremental redundancy scheme by incremental redundancy block 810, a circular buffer may be used such as that shown in FIG. 10. As shown in FIG. 10, the error correction code word or code words providing encoded control information is written into a circular buffer 1000 as represented by an inner arrow 1001. As shown in FIG. 10, a first encoded data unit providing a first redundancy version is formed by reading the encoded symbols from the circular buffer represented by an arrow 1002 from a start location 1004 to an end location 1006. A second encoded data unit providing a second redundancy version is formed by reading the encoded bits from a start location 1006 to an end location 1008 as represented by a second circular arrow 1010. A third encoded data unit providing a third redundancy version is generated by reading the error correction encoded bits from the start location 1008 to an end location 1012 as represented by a circular arrow 1014. A fourth encoded data unit providing a fourth redundancy version is produced by reading the error correction encoded bits from a start location 1012 to an end location 1016 as represented by the arrow 1018.

As will be appreciated, the example shown in FIG. 10 provides four different encoded data units for four redundancy versions but any number could be generated, e.g. depending on the size of the encoded control information or a size of the PDCCH resources on which encoded data unit is to be transmitted. Furthermore, although the term "bits" is used in respect of encoded data bits, it will be appreciated that error correction encoding schemes can perform encoding on the basis of n-ary data and so data is encoded as symbols. Although the term "bits" has been used instead of symbols, it will be appreciated that the term symbols can be used interchangeably with bits.

According to some example embodiments the UE may receive an indication of a total number of the encoded data units which are used to transmit the encoded control information. The total number of encoded data units may be received as part of system information broadcast from the network, configured as part of RRC signalling or it may be pre-specified. In other examples, the total number of the encoded data units which are used to transmit the encoded control information is determined from a number of aggregation levels which are configured for receiving the encoded control information transmitted via the control channel.

According to the example embodiment illustrated in FIG. 10, the mother code is input into the circular buffer 1000, and four encoded data units providing four redundancy versions are formed for transmission via PDCCHs using incremental redundancy are shown. As shown in FIG. 10, unused bits in the mother code can be avoided for the repetition.

Figure 11:
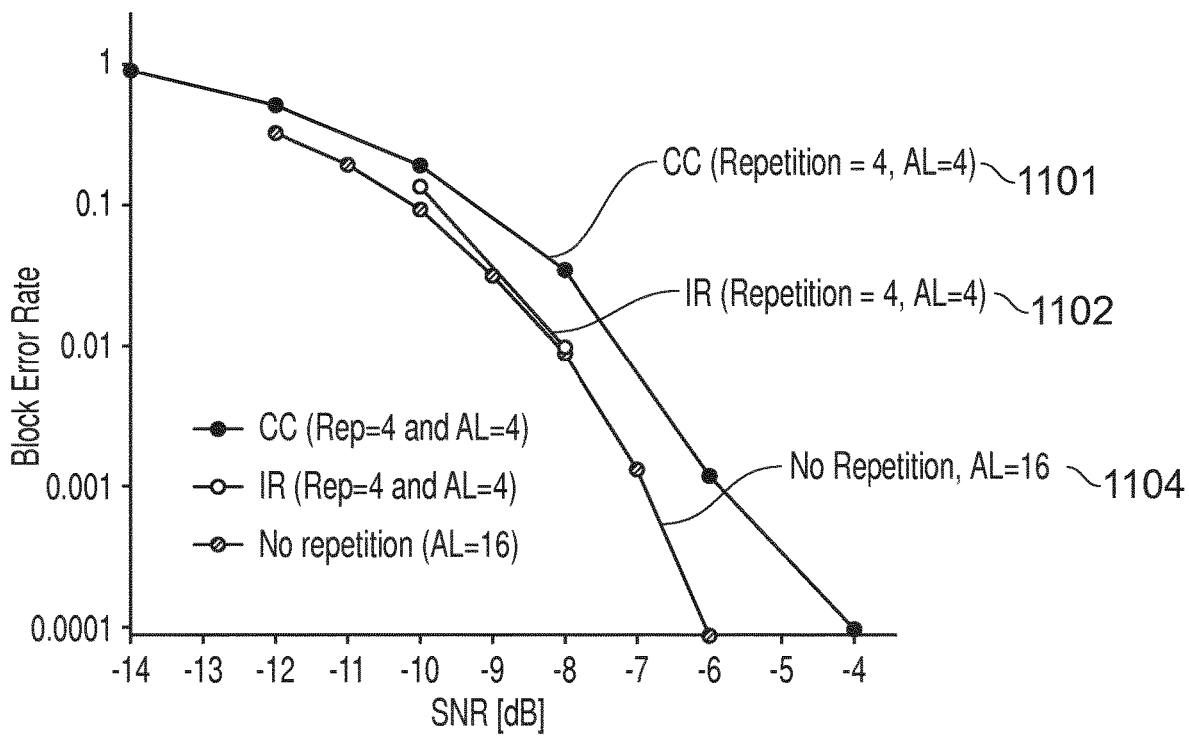
FIG. 11 is a set of graphical plots of block error rate against signal to noise ratio for repetition numbers and aggregation levels illustrating the performance of an incremental redundancy and a chase combining scheme according to example embodiments.

Embodiments of the present technique can provide an advantage by improving an integrity and/or reliability of the transmitted control information. A performance of the incremental redundancy scheme is represented by a graphical plot of block error rate (BLER) against signal to noise ratio in FIG. 11, which corresponds to the graphical plots shown in FIG. 6. As shown in FIG. 11 for a first plot 1101 illustrates the performance of using a chase combining scheme, which is worse than either the incremental redundancy plot 1102 with a repetition of 4 and an aggregation level of 4 or an example plot 1104 with no repetition and an aggregation level 16. In accordance with example embodiments of the present technique the performance for the incremental redundancy scheme with repetition for an aggregation level 4 is the same as the performance for no repetition and an aggregation level of 16, which therefore provides an improvement because the same performance can be achieved by a much lower aggregation level. Furthermore there is a significant improvement compared with chase combining.

Recognizing RV (Redundancy Version) for PDCCH Repetition Using Incremental Redundancy As explained above with reference to FIG. 10, the redundancy version indicates a location or a starting bit of the rate matching output bit sequence in the circular buffer. For example, the first, second, third and fourth PDCCH in FIG. 10 can be defined as RV 0, 1, 2 and 3 respectively. As indicated above, each redundancy version provides a different section of encoded symbols of a code word or code words. Conventionally the UE blindly decodes the PDCCH, according to a search space, to detect the control information such as the DCI, because the UE does not know a transmission timing and resource of the PDCCH. In the blind decoding operations, the UE attempts to decode candidates of the PDCCH based on a known set of hypotheses of PDCCH candidates. When the control information is transmitted repeatedly in the PDCCH using incremental redundancy, the UE needs further to determine a redundancy version of the PDCCH so that it can reassemble the encoded symbols into the encoded code word. Therefore example embodiments can provide a UE configured to determine the redundancy version received according to an incremental redundancy scheme so that the code word or code words representing the encoded control information can be reassembled for decoding. In one embodiment, the UE is configured to implicitly determine the redundancy version number by using existing parameter/information, as explained by the examples listed below. Since the redundancy version number can be implicitly indicated by existing parameters or other information, no additional signalling or at least a reduced amount of signalling may be necessary. The techniques for identifying the redundancy version include:

OFDM symbol number

The redundancy version number of the PDCCH is associated with a reference OFDM symbol number within a slot. The reference OFDM symbol number can be the first OFDM symbol of a CORESET monitoring the PDCCH or the first OFDM symbol of the PDCCH. As an example, for a CORESET consisting of three OFDM symbols in the $4^{th}$, $5^{th}$ and $6^{th}$ OFDM symbols (i.e. OFDM symbols with indices 3, 4, 5, where the first OFDM symbol in the slot has an index of 0) of the subframe or the slot, the OFDM symbol with index 3 is the reference OFDM symbol number and the redundancy version number is based on the reference OFDM symbol number with index 3.

The actual redundancy version number can then be determined by a mapping table between the reference OFDM symbol number and the redundancy version number, for example:

| Reference OFDM symbol number | Redundancy version |
|---|---|
| 0 | 0 |
| 3 | 2 |
| 7 | 3 |
| 10 | 1 |

Each slot consists of 14 OFDM symbols. The redundancy version number is cyclically determined within the 14 OFDM symbols. For example, the redundancy version number is determined by mod (x,Nrv), where mod means modulo operation, x is the reference OFDM symbol number, and Nrv is the number of redundancy versions. In another example, the redundancy version number is determined by mod(floor(x/C),Nrv), where C is the number of symbols in the CORESET.

In addition or alternatively, the redundancy version number is further associated with, mini-slot number, slot number, subframe number and/or radio frame number.

PDCCH monitoring pattern within a slot

The redundancy version number of the PDCCH is associated with the PDCCH monitoring pattern within a slot, which is configured by radio resource control (RRC) signalling. A slot is an example of a time divided unit of the wireless access interface, a further division of the time unit forming a mini-slot.

Information bits of the signalling indicate the OFDM symbols for PDCCH monitoring in the slot configured for PDCCH monitoring. The information consists of bitmap information of length 14 bits, and each bit corresponds to each OFDM symbol within a slot. For example, if a bit within the bitmap indicates "1" for an OFDM symbol, the OFDM symbol is the first OFDM symbol of a PDCCH monitoring occasion.

Figure 12:
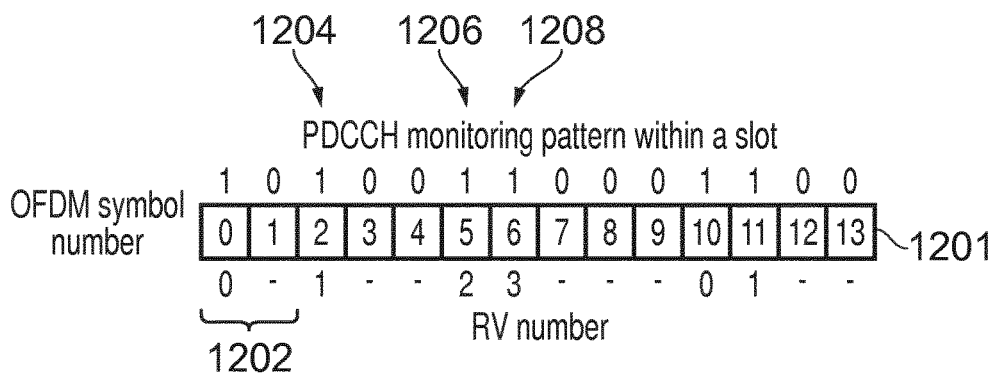
FIG. 12 is a schematic representation of an information signal providing a bit map between transmitted redundancy versions and OFDM symbol numbers.

The redundancy version number is cyclically determined within the OFDM symbols which are indicated for PDCCH monitoring as shown in FIG. 12. FIG. 12 provides an example illustration of a technique for determining a redundancy version using a bit pattern that marks the start of PDCCH monitoring occasions. In FIG. 12 a bit map of 14 bits 1201 is shown. According to the present technique, the presence of a 1 in a first of a pair of bit positions 1202 indicates the position of a first PDCCH monitoring occasion associated with a first redundancy version in the corresponding OFDM symbols of the PDCCH. As shown in FIG. 12, a second 1 at bit position 2 1204 indicates the position of a second PDCCH monitoring occasion associated with a second redundancy version on the corresponding OFDM symbols whereas bit positions 5 1206 and 6 1208 illustrate the positions of PDCCH monitoring occasions corresponding to OFDM symbols 5 and 6 associated with third and fourth redundancy version respectively. As illustrated in the example embodiment shown in FIG. 12, the redundancy version number of the PDCCH is based on the position of the PDCCH monitoring occasion, where the positions of the PDCCH monitoring occasions are defined by the signalled bitmap. The relationship between redundancy version and PDCCH monitoring occasion can be based on a mapping table, as illustrated in the table below:

TABLE A exemplary mapping between PDCCH monitoring occasion and redundancy version

| PDCCH monitoring occasion | Redundancy version |
|---|---|
| First in slot 1202 | 0 |
| Second in slot 1204 | 2 |

TABLE A-continued exemplary mapping between PDCCH monitoring
occasion and redundancy version

| PDCCH monitoring occasion | Redundancy version |
|---|---|
| Third in slot 1206 | 3 |
| Fourth in slot 1208 | 1 |

In addition, the redundancy version number can be further associated with slot number and/or radio frame number. For example, the mapping table shown in Table A could change as a function of a slot number.

CCE index/REG index

A CCE index/a REG index is defined in each CORESET.

The redundancy version number of the PDCCH is associated with CCE index/REG index that carries the PDCCH. The CCE index/REG index can be the first CCE index/first REG index of the PDCCH.

The redundancy version number is cyclically associated with CCEs/REGs in a CORESET The redundancy version number of the PDCCH is the redundancy version number associated with the first CCE index/first REG index of the PDCCH (e.g. a PDCCH whose first CCE index is '0' is associated with RV0, a PDCCH whose first CCE index is '1' is associated with RV2 etc.). The base station can use different redundancy versions for different repetitions of the PDCCH by transmitting the repeated PDCCHs in PDCCH candidates having different first CCE indices.

CORESET

In the case where the PDCCH is repeated across multiple CORESETs, for example a two times repetition where the first repetition is in a first CORESET and the $2^{nd}$ repetition is in another CORESET, the CORESET where the PDCCH is detected would implicitly indicate the redundancy version.

PDCCH repetition number

In the case where the PDCCH repetitions form a search space, such as those used in eMTC, the $n^{th}$ repetition of a PDCCH would give the redundancy version number. For example, if a PDCCH is repeated four times, the $1^{st}$ repetition is associated with redundancy version=0, the $2^{nd}$ repetition is redundancy version=2, the $3^{rd}$ repetition is associated with redundancy version=3 and $4^{th}$ repetition is associated with redundancy version=1 (NOTE: the redundancy version order does not need to be in ascending order of the repetition)

In another embodiment, the UE blindly detects the redundancy version of the PDCCH. If the number of redundancy versions is four, the UE attempts to decode four different redundancy versions for each candidate of the PDCCH. Although the UE processing load for PDCCH monitoring increases, any additional indications of redundancy version (whether implicit or explicit) are not necessary and any scheduling restriction due to implicit indication by other parameters does not occur or is at least reduced.

While the examples discussed previously have been described with respect to PDCCH repetitions occupying different temporal resources, they are also applicable to PDCCH repetitions occupying different frequency resources. For example, two PDCCH repetitions can be transmitted in the same OFDM symbol and the redundancy version applied to the PDCCH repetition can be implicitly based on the first CCE index in the candidate in which the PDCCH is transmitted.

Switching Between the PDCCH Repetition Schemes Using CC (Chase Combining) and IR (Incremental Redundancy)

As explained in the above, PDCCH repetition using incremental redundancy improves the transmission performance. On the other hand, PDCCH repetition using chase combining as described previously with reference to FIG. 4 has an advantage that the UE does not need to know the redundancy version number. The requirement for the UE to know the redundancy version number can increase UE processing complexity or power consumption. It can also restrict the operation of the scheduler (the scheduler may be restricted in terms of the candidates it can use for transmitting PDCCH repetitions). According to some embodiments therefore the PDCCH repetition scheme can be dynamically/semi-statically switched between chase combining and incremental redundancy schemes. Here dynamic switching means the PDCCH repetition scheme is dynamically determined to be either chase combining or incremental redundancy, e.g. on a slot-by-slot or symbol-by-symbol basis, using implicit indication, where the implicit indication can either be linked to different search space types or different services, or explicit indication, where the explicit indication can be performed through the transmission of signalling information, for example at RRC establishment.

Embodiments of the present technique can therefore provide a method of operating a communications device to receive data from a wireless communications network, the method comprising detecting from a control channel of a wireless access interface one or more encoded data units of a plurality of encoded data units into which an error correction encoded control information has been divided, and decoding the error correction encoded control information by combining the one or more detected encoded data units in accordance with an arrangement of encoded bits of the error correction encoded control information in each of the encoded data units. The plurality of encoded data units into which an error correction encoded control information has been divided are transmitted in accordance with either a repeated transmission of one or more sections into which the error correction encoded control information is divided, or an incremental redundancy scheme in which each of the plurality of encoded data units includes different sets of encoded bits of the error correction encoded control information, each encoded data unit including the different sets of the encoded bits for each of the encoded data units having a different redundancy version number according to the incremental redundancy scheme. The combining the one or more encoded data units includes determining whether the error correction encoded control information has been transmitted in accordance with the repeated transmission or the incremental redundancy scheme, and if the error correction encoded control information has been transmitted in accordance with the incremental redundancy scheme, combining the one or more detected encoded data units in accordance with the incremental redundancy scheme, or if the error correction encoded control information has been transmitted in accordance with the repeated transmission, combining the encoded data units of the repeated transmission of the one or more sections of the error correction encoded control information in accordance with a chase combining scheme.

In one embodiment, the PDCCH repetition schemes of chase combining or incremental redundancy can be determined by one or both of the UE and gNB based on the application (use-case), for example whether the data being communicated according to an eMBB, URLLC or mMTC use case. For example, the chase combining-based repetition scheme can be used for eMBB or mMTC, and the incremental redundancy-based repetition scheme can be used for URLLC. The UE is hence assigned a use-case service type (eMBB, URLLC or mMTC) and applies either chase combining or incremental redundancy, as appropriate.

In another embodiment, the PDCCH repetition scheme of chase combining or incremental redundancy can be implicitly switched by other parameter/information as follows.

Search space type

The PDCCH repetition scheme of chase combining or incremental redundancy is implicitly determined by search space type. The search space type is configured for each search space, and can be common search space (CSS) or UE-specific search space (USS).

For example, when a UE is configured with the PDCCH repetition, the chase combining based repetition scheme is used in the CSS and the incremental redundancy based repetition scheme is used in the USS.

For another example, a UE is configured with only the chase combining based repetition scheme for the CSS, and the UE is configured with either the chase combining based repetition scheme or the incremental redundancy based repetition scheme for the USS.

PDSCH mapping type

The PDCCH repetition scheme of chase combining or incremental redundancy is implicitly determined by PDSCH mapping type. The PDSCH mapping type can be type A or B. For type A, slot-based scheduling can be performed. For type B, mini-slot (non-slot) based scheduling can be performed.

For example, when a UE is configured with PDCCH repetition, the chase combining based repetition scheme is used for slot-based scheduling and the incremental redundancy based repetition scheme is used for mini-slot based scheduling.

In another example, a UE is configured with only the chase combining based repetition scheme for slot-based scheduling, and the UE is configured with either the chase combining based repetition scheme or the incremental redundancy based repetition scheme for mini-slot based scheduling.

DCI format

Some DCI formats use chase combining whilst others use incremental redundancy. For example, a new compact DCI may be introduced for scheduling of URLLC and hence when the UE is decoding for this new compact DCI, it will use incremental redundancy scheme and for the legacy DCI format, it will use chase combining.

RNTI

When URLLC data is scheduled, the gNB can use an MCS-C-RNTI to identify the UE rather than a C-RNTI. When PDCCH is repeated, the use of a chase combining scheme or an incremental redundancy scheme can be based on whether the PDCCH is transmitted using an MCS-C-RNTI (where an incremental redundancy scheme can be used) or using a C-RNTI (where a chase combining scheme can be used).

In another embodiment, the PDCCH repetition scheme of chase combining or incremental redundancy is explicitly indicated as follows.

Group common PDCCH

The PDCCH repetition scheme of chase combining or incremental redundancy is explicitly indicated by group common PDCCH. The group common PDCCH is transmitted in the CSS, and can be received by several UEs. An RNTI for the group common PDCCH is different from an RNTI for a UE-specific PDCCH.

SUMMARY

Figure 13:
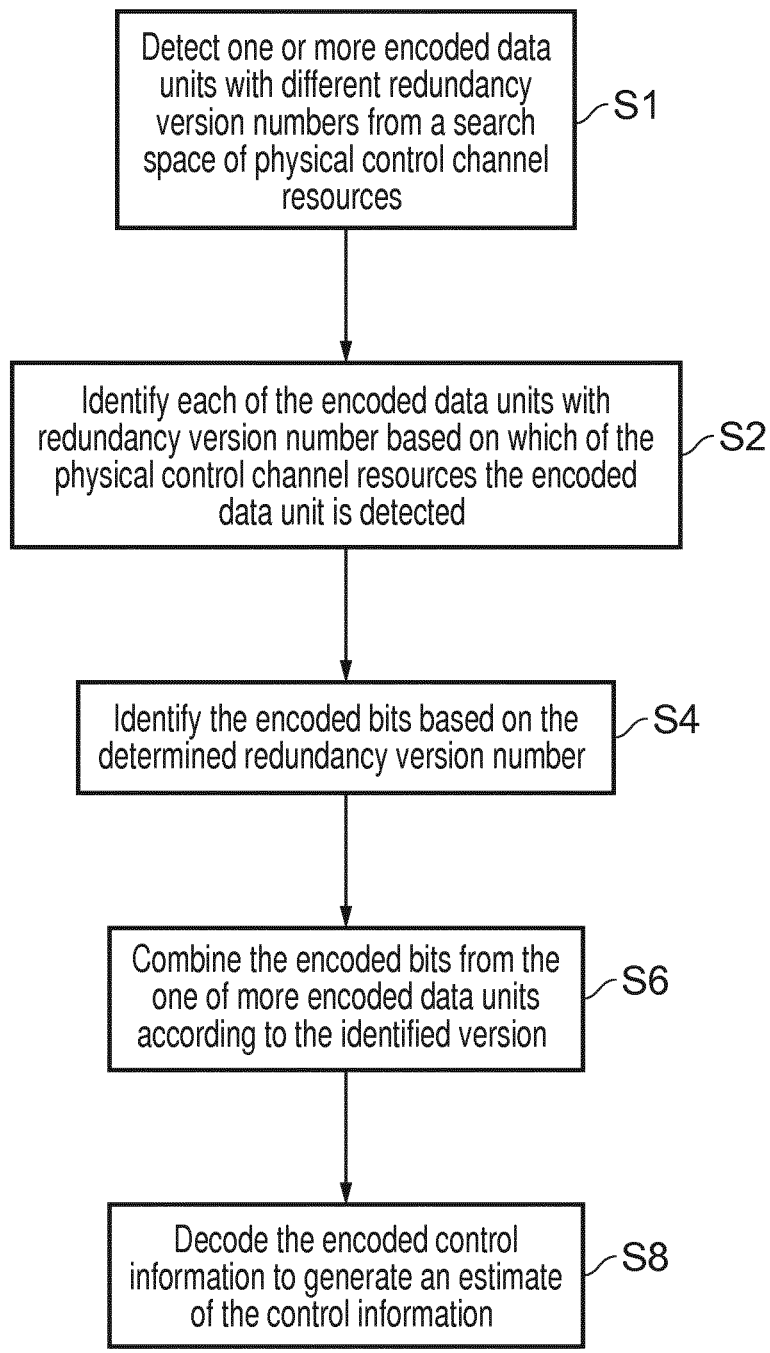
FIG. 13 is a flow diagram providing an example operation of a communications device to receive control information using an incremental redundancy scheme according to example embodiments.

A flow diagram illustrating an example operation of a UE in detecting control information transmitted in accordance with the present technique is shown in FIG. 13. As shown in FIG. 13 at a first step S1, the UE controller uses the numbered aggregation levels and the number of redundancy versions (encoded data units) to search the control channel elements of the physical control channel to detect the encoded data units corresponding to different redundancy version numbers. In one example the UE may blind decode the encoded data units. In another example, the UE is informed of the location of the encoded data units in the control channel elements.

In S2, the second step, the UE identifies each of the encoded data units based on the resources of the physical control channel on which each of the encoded data unit is detected. Identifying the encoded data unit corresponding to a particular redundancy version number the UE can identify a format of the encoded bits corresponding to the redundancy version number of the incremental redundancy scheme. The UE therefore adapts the decoding technique based on the identified redundancy version of the encoded data unit. This is achieved in step S4 in which the UE controller identifies the encoded bits based on the determined redundancy version number of the encoded data unit and in step S6 combines the encoded bits from each of the one or more encoded data units according to their identified redundancy version number to reconstitute an encoded control information code word. Finally, at step S8 the UE decodes the encoded code word to generate an estimate of the control information such as the DCI. Accordingly therefore the UE then proceeds to identify the resources of the shared channel on which, for example, the URLLC is transmitted.

The above described embodiments have been described with reference to polar codes. However it will be appreciated that other encoding schemes can be used such as tail-biting convolutional codes and any code for which rate matching such as puncturing/repetition of the mother code can be used.

Those skilled in the art would further appreciate that such infrastructure equipment and/or communications devices as herein defined may be further defined in accordance with the various arrangements and embodiments discussed in the preceding paragraphs. It would be further appreciated by those skilled in the art that such infrastructure equipment and communications devices as herein defined and described may form part of communications systems other than those defined by the present invention.

The following numbered paragraphs provide further example aspects and features of the present technique:

Paragraph 1. A method of operating a communications device to receive data from a wireless communications network, the method comprising detecting from one or more control channels of a wireless access interface one or more encoded data units of a plurality of encoded data units into which an error correction encoded control information has been divided in accordance with an incremental redundancy scheme, and decoding the error correction encoded control information by combining the one or more detected encoded data units in accordance with an arrangement of encoded bits of the error correction encoded control information in each of the plurality of encoded data units, each of the plurality of encoded data units comprising a different set of the encoded bits according to a different redundancy version number of the incremental redundancy scheme, wherein the combining the one or more detected encoded data units includes identifying each of the one or more encoded data units from physical resources on which the one or more encoded data units are detected to determine the redundancy version of each encoded data unit, identifying the arrangement of encoded bits of the error correction encoded control information in each of the one or more encoded data units based on the determined redundancy version, and combining the encoded bits from the one or more encoded data units in accordance with the incremental redundancy scheme.

Paragraph 2. A method according to paragraph 1, wherein the physical resources of the control channel of the wireless access interface comprises a plurality of Orthogonal Frequency Division Multiplexing, OFDM, symbols and the identifying each of the one or more encoded data units from the physical resources on which the one or more encoded data units are detected, comprises determining a number of the OFDM symbol on which each of the one or more encoded data units were detected, each of the one or more encoded data unit having been transmitted on a resource including a corresponding one of the plurality of OFDM symbols of the control channel, and identifying the encoded data unit from the number of the OFDM symbol of the control channel on which the encoded data unit was detected.

Paragraph 3. A method according to paragraph 1 or 2, wherein the physical resources of the wireless access interface are divided into a plurality of synchronous time divided units, and the identifying each of the one or more encoded data units from the physical resources on which the one or more encoded data units are detected comprises determining a number of the time unit in which the one or more encoded data units are detected, each of the one or more encoded data units having been transmitted in a resource including a corresponding time unit number, and identifying the encoded data unit from the number of the time unit on which the encoded data unit was detected.

Paragraph 4. A method according to any of paragraphs 1, 2 or 3, comprising receiving a control message indicating which of the plurality of OFDM symbols on the control channel a corresponding one of the encoded data units was transmitted.

Paragraph 5. A method according to paragraph 1, wherein the physical resources of the wireless access interface are divided into a plurality of synchronous time divided units and the identifying each of the one or more encoded data units from the physical resources on which the one or more encoded data units are detected, comprises determining a pattern of the physical resources from which the one or more encoded data units are detected, each of the one or more encoded data units having been transmitted in a resource including one of the time units using the physical resources of the control channel of the wireless access interface in accordance with one of a set of different patterns, and determining the encoded data unit by identifying the pattern of the physical resources of the control channel within a time unit of the wireless access interface.

Paragraph 6. A method according to paragraph 1, wherein the physical resources of the wireless access interface are divided into a plurality of synchronous time divided units and the identifying each of the one or more encoded data units from the physical resources on which the one or more encoded data units are detected, comprises determining control channel monitoring occasions from a pattern of the physical resources on which the one or more encoded data units are detected, each of the one or more encoded data units having been transmitted in a resource starting in a first time unit of the control channel monitoring occasion.

Paragraph 7. A method according to paragraph 5 or 6, wherein the physical resources of the control channel are divided into control channel elements with an index, the control channel elements forming part of a resource element group which have a resource element group index, and each of the patterns of the physical resources is dependent upon the control channel element index and the resource element group index.

Paragraph 8. A method according to paragraph 7, wherein the physical resources of the control channel are divided into control channel elements with an index, and the encoded data unit is determined based on the physical resources comprising at least a control channel index with a particular index.

Paragraph 9. A method according to paragraph 7, wherein the control channel elements and the resource element groups are formed from a control resource set of physical resources of the control channel for each of the time units, and the identifying each of the one or more encoded data units from the physical resources on which the one or more encoded data units are detected includes determining the control resource set from which the encoded data unit was detected.

Paragraph 10. A method according to paragraph 1, wherein the identifying each of the one or more encoded data units from the physical resources on which the one or more encoded data units are detected comprises searching for the encoded data units within a search space formed within the physical resources of the control channel and determining the encoded data unit from an order in which the encoded data units are detected.

Paragraph 11. A method according to any of paragraphs 1 to 10, comprising receiving an indication of a total number of the encoded data units which are used to transmit the control information.

Paragraph 12. A method according to any of paragraphs 1 to 10, comprising determining a total number of the encoded data units which are used to transmit the control information from a number of aggregation levels which are configured for receiving control information transmitted via the control channel.

Paragraph 13. A method according to any of paragraphs 1 to 10, comprising using the control information to receive data transmitted to the communications device on a shared channel of the wireless access interface, to signal that the communications device should transmit on uplink resources, such as on the Physical Uplink Shared Channel (PUSCH), to request the communications device to perform a function or to send timing advance information.

Paragraph 14. A method of operating a communications device to receive data from a wireless communications network, the method comprising detecting from a control channel of a wireless access interface one or more encoded data units of a plurality of encoded data units into which an error correction encoded control information has been divided, and decoding the error correction encoded control information by combining the one or more detected encoded data units in accordance with an arrangement of encoded bits of the error correction encoded control information in each of the encoded data units, wherein the plurality of encoded data units into which an error correction encoded control information has been divided are transmitted in accordance with either a repeated transmission of one or more sections into which the error correction encoded control information is divided, or an incremental redundancy scheme in which each of the plurality of encoded data units includes a different set of encoded bits of the error correction encoded control information, each encoded data unit including the different set of the encoded bits having a different redundancy version number according to the incremental redundancy scheme, and the combining the one or more encoded data units includes determining whether the error correction encoded control information has been transmitted in accordance with the repeated transmission or the incremental redundancy scheme, and if the error correction encoded control information has been transmitted in accordance with the incremental redundancy scheme, combining the one or more detected encoded data units in accordance with the incremental redundancy scheme, or if the error correction encoded control information has been transmitted in accordance with the repeated transmission, combining the encoded data units of the repeated transmission of the one or more sections of the error correction encoded control information in accordance with a chase combining scheme.

Paragraph 15. A method according to paragraph 14, comprising the combining the encoded data units in accordance with the incremental redundancy scheme comprises identifying each of the one or more encoded data units from physical resources on which the one or more encoded data units are detected to determine the redundancy version number of each encoded data unit, identifying the arrangement of encoded bits of the error correction encoded control information in each of the one or more encoded data units based on the determined redundancy version number, and combining the encoded bits from the one or more encoded data units in accordance with the incremental redundancy scheme.

Paragraph 16. A method according to paragraph 14 or 15, wherein the error correction encoded control information is transmitted using either the repeated transmission or the incremental redundancy scheme depending on a search space type, and the determining whether the error correction encoded control information has been transmitted in accordance with the repeated transmission or the incremental redundancy scheme includes determining the search space type.

Paragraph 17. A method according to paragraph 16, wherein the search space type is one of a common search space or a search space specific to the communications device.

Paragraph 18. A method according to paragraph 14 or 15, wherein the error correction encoded control information is transmitted using either the repeated transmission or the incremental redundancy scheme depending on a transmission of the data in the shared channel on a time unit into which the wireless access interface is divided or a sub-time unit into which the time unit is divided, and the determining whether the error correction encoded control information has been transmitted in accordance with the repeated transmission or the incremental redundancy scheme includes determining whether the data is being transmitted in the shared channel on a time unit or a sub-time unit basis.

Paragraph 19. A method according to paragraph 18, wherein the time-unit is a slot of a sub-frame of the wireless access interface and sub-time unit is a mini-slot.

Paragraph 20. A method according to paragraph 14 or 15, wherein the control information is downlink control information and the error correction encoded control information is transmitted using either the repeated transmission or the incremental redundancy scheme depending on a format of the downlink control information, and the determining whether the error correction encoded control information has been transmitted in accordance with the repeated transmission scheme or the incremental redundancy scheme includes determining the downlink control information format.

Paragraph 21. A method according to paragraph 14 or 15, wherein the determining whether the error correction encoded control information has been transmitted in accordance with the repeated transmission scheme or the incremental redundancy scheme comprises receiving a control information message transmitted on a group common control channel for communications devices.

Paragraph 22. A communications device for receiving data from a wireless communications network, the communications device comprising receiver circuitry configured to receive radio signals transmitted via a wireless access interface provided by the wireless communications network, and controller circuitry configured to control the receiver circuitry to detect from one or more control channels of a wireless access interface one or more encoded data units of a plurality of encoded data units into which an error correction encoded control information has been divided in accordance with an incremental redundancy scheme, and to decode the error correction encoded control information by combining the one or more detected encoded data units in accordance with an arrangement of encoded bits of the error correction encoded control information in each of the plurality of encoded data units, each of the plurality of encoded data units comprising a different set of the encoded bits according to a different redundancy version number of the incremental redundancy scheme, wherein the combining the one or more detected encoded data units includes identifying each of the one or more encoded data units from physical resources on which the one or more encoded data units are detected to determine the redundancy version of each encoded data unit, identifying the arrangement of encoded bits of the error correction encoded control information in each of the one or more encoded data units based on the determined redundancy version, and combining the encoded bits from the one or more encoded data units in accordance with the incremental redundancy scheme.

Paragraph 23. A communications device for receiving data from a wireless communications network, the communications device comprising receiver circuitry configured to receive radio signals transmitted via a wireless access interface provided by the wireless communications network, and controller circuitry configured to control the receiver circuitry to detect from a control channel of a wireless access interface one or more encoded data units of a plurality of encoded data units into which an error correction encoded control information has been divided, and to decode the error correction encoded control information by combining the one or more detected encoded data units in accordance with an arrangement of encoded bits of the error correction encoded control information, wherein the plurality of encoded data units into which an error correction encoded control information has been divided are transmitted in accordance with either a repeated transmission of one or more sections into which the error correction encoded control information is divided, or an incremental redundancy scheme in which each of the plurality of encoded data units includes different sets of encoded bits of the error correction encoded control information, each encoded data unit including the different sets of the encoded bits for each of the encoded data units having a different redundancy version number according to the incremental redundancy scheme, and the combining the one or more encoded data units includes determining whether the error correction encoded control information has been transmitted in accordance with the repeated transmission or the incremental redundancy scheme, and if the error correction encoded control information has been transmitted in accordance with the incremental redundancy scheme, combining the one or more detected encoded data units in accordance with the incremental redundancy scheme, or if the error correction encoded control information has been transmitted in accordance with the repeated transmission, combining the encoded data units of the repeated transmission of the one or more sections of the error correction encoded control information in accordance with a chase combining scheme.

Paragraph 24. An infrastructure equipment for forming part of a wireless communications network, the infrastructure equipment comprising transmitter circuitry configured to transmit radio signals via a wireless access interface provided by the wireless communications network, and controller circuitry configured to control the transmitter circuitry to form control information for transmission, to encode the control information to generate error correction encoded control information, to form a plurality of encoded data units from the control information according to an incremental redundancy scheme, providing each of the plurality of encoded data units with a different arrangement of encoded bits of the error correction encoded control information according to a different redundancy version number of the incremental redundancy scheme, and to transmit the plurality of encoded data units on one or more control channels of the wireless access interface, wherein each of the plurality of encoded data units into which the error correction encoded control information has been divided in accordance with the incremental redundancy scheme is transmitted on different physical resource of the one or more control channels, the different physical resources identifying the encoded data unit according to the redundancy version number of the incremental redundancy scheme.

Paragraph 25. An infrastructure equipment according to paragraph 24, wherein the transmitter circuitry comprises an error correction encoder configured to receive the control information and to encode the control information in accordance with an error correction encode to form the error correction control information, and a rate matching encoder including an incremental redundancy encoder configured to receive the error correction encoded control information and to form from the error correction encoded control information the plurality of encoded data units, each of the plurality of encoded data units comprising a different set of the encoded bits of the error correction encoded control information, and a rate match controller configured to arrange the encoded data units corresponding to a different redundancy version number for transmission via the different physical resources identifying the encoded data unit according to the redundancy version number.

Paragraph 26. An infrastructure equipment according to paragraph 25, wherein the incremental redundancy encoder includes a circular buffer and the rate match controller is configured to write the error correction encoded control information into the circular buffer and to read out sequential the encoded bit of the error correction encoded control information according to a number of bits carried by each of the encoded data units, and according to the incremental redundancy scheme a start address of the read out is different to form the different redundancy versions.

Paragraph 27. An infrastructure equipment according to paragraph 26, wherein the rate match controller is configured to repeat each of the encoded data units a number of times for transmission.

Paragraph 28. An infrastructure equipment for forming part of a wireless communications network, the infrastructure equipment comprising transmitter circuitry configured to transmit radio signals via a wireless access interface provided by the wireless communications network, and controller circuitry configured to control the transmitter circuitry to form control information for transmission, to encode the control information to generate error correction encoded control information, to form a plurality of encoded data units from the error correction encoded control information, and to transmit the plurality of encoded data units on one or more control channels of the wireless access interface, wherein the plurality of encoded data units are formed from the error correction encoded control information in accordance with either a repeated transmission of one or more sections into which the error correction encoded control information is divided, or an incremental redundancy scheme providing each of the plurality of encoded data units with a different arrangement of encoded bits of the error correction encoded control information according to a different redundancy version number of the incremental redundancy scheme, each of the plurality of encoded data units of the error correction encoded control information being formed in accordance with the incremental redundancy scheme being transmitted on different physical resource of the one or more control channels, the different physical resources identifying the encoded data unit according to the redundancy version number of the incremental redundancy scheme.

Paragraph 29. A method of operating an infrastructure equipment of a wireless communications network, the method comprising forming control information for transmission, encoding the control information to generate error correction encoded control information, forming a plurality of encoded data units from the control information according to an incremental redundancy scheme, providing each of the plurality of encoded data units with a different arrangement of encoded bits of the error correction encoded control information according to a different redundancy version number of the incremental redundancy scheme, and transmitting the plurality of encoded data units on one or more control channels of the wireless access interface, wherein each of the plurality of encoded data units into which the error correction encoded control information has been divided in accordance with the incremental redundancy scheme is transmitted on different physical resource of the one or more control channels, the different physical resources identifying the encoded data unit according to the redundancy version number of the incremental redundancy scheme.

Paragraph 30. A method of operating an infrastructure equipment of a wireless communications network, the method comprising forming control information for transmission, encoding the control information to generate error correction encoded control information, forming a plurality of encoded data units from the error correction encoded control information, and transmitting the plurality of encoded data units on one or more control channels of the wireless access interface, wherein the plurality of encoded data units are formed from the error correction encoded control information in accordance with either a repeated transmission of one or more sections into which the error correction encoded control information is divided, or an incremental redundancy scheme providing each of the plurality of encoded data units with a different arrangement of encoded bits of the error correction encoded control information according to a different redundancy version number of the incremental redundancy scheme, each of the plurality of encoded data units of the error correction encoded control information being formed in accordance with the incremental redundancy scheme being transmitted on different physical resource of the one or more control channels, the different physical resources identifying the encoded data unit according to the redundancy version number of the incremental redundancy scheme.

Paragraph 31. Circuitry for receiving data from a wireless communications network, the circuitry comprising receiver circuitry configured to receive radio signals transmitted via a wireless access interface provided by the wireless communications network, and controller circuitry configured to control the receiver circuitry to detect from one or more control channels of a wireless access interface one or more encoded data units of a plurality of encoded data units into which an error correction encoded control information has been divided in accordance with an incremental redundancy scheme, and to decode the error correction encoded control information by combining the one or more detected encoded data units in accordance with an arrangement of encoded bits of the error correction encoded control information in each of the plurality of encoded data units, each of the plurality of encoded data units comprising a different set of the encoded bits according to a different redundancy version number of the incremental redundancy scheme, wherein the combining the one or more detected encoded data units includes identifying each of the one or more encoded data units from physical resources on which the one or more encoded data units are detected to determine the redundancy version of each encoded data unit, identifying the arrangement of encoded bits of the error correction encoded control information in each of the one or more encoded data units based on the determined redundancy version, and combining the encoded bits from the one or more encoded data units in accordance with the incremental redundancy scheme.

Paragraph 32. Circuitry for receiving data from a wireless communications network, the circuitry comprising receiver circuitry configured to receive radio signals transmitted via a wireless access interface provided by the wireless communications network, and controller circuitry configured to control the receiver circuitry to detect from a control channel of a wireless access interface one or more encoded data units of a plurality of encoded data units into which an error correction encoded control information has been divided, and to decode the error correction encoded control information by combining the one or more detected encoded data units in accordance with an arrangement of encoded bits of the error correction encoded control information, wherein the plurality of encoded data units into which an error correction encoded control information has been divided are transmitted in accordance with either a repeated transmission of one or more sections into which the error correction encoded control information is divided, or an incremental redundancy scheme in which each of the plurality of encoded data units includes different sets of encoded bits of the error correction encoded control information, each encoded data unit including the different sets of the encoded bits for each of the encoded data units having a different redundancy version number according to the incremental redundancy scheme, and the combining the one or more encoded data units includes determining whether the error correction encoded control information has been transmitted in accordance with the repeated transmission or the incremental redundancy scheme, and if the error correction encoded control information has been transmitted in accordance with the incremental redundancy scheme, combining the one or more detected encoded data units in accordance with the incremental redundancy scheme, or if the error correction encoded control information has been transmitted in accordance with the repeated transmission, combining the encoded data units of the repeated transmission of the one or more sections of the error correction encoded control information in accordance with a chase combining scheme.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure.

It will be appreciated that the above description for clarity has described embodiments with reference to different functional units, circuitry and/or processors. However, it will be apparent that any suitable distribution of functionality between different functional units, circuitry and/or processors may be used without detracting from the embodiments.

Described embodiments may be implemented in any suitable form including hardware, software, firmware or any combination of these. Described embodiments may optionally be implemented at least partly as computer software running on one or more data processors and/or digital signal processors. The elements and components of any embodiment may be physically, functionally and logically implemented in any suitable way. Indeed the functionality may be implemented in a single unit, in a plurality of units or as part of other functional units. As such, the disclosed embodiments may be implemented in a single unit or may be physically and functionally distributed between different units, circuitry and/or processors.

Although the present disclosure has been described in connection with some embodiments, it is not intended to be limited to the specific form set forth herein. Additionally, although a feature may appear to be described in connection with particular embodiments, one skilled in the art would recognise that various features of the described embodiments may be combined in any manner suitable to implement the technique.

REFERENCES

[1] Holma H. and Toskala A, "LTE for UMTS OFDMA and SC-FDMA based radio access", John Wiley and Sons, 2009.
[2] RP-172834, "Revised WID on New Radio Access Technology," NTT DOCOMO, RAN #78.
[3] TR 38.913, "Study on Scenarios and Requirements for Next Generation Access Technologies (Release 14)".
[4] 3GPP Organisation, "5G Communication for Automation in Vertical Domains", [Online], Available at: http://www.3gpp.org/news-events/3gpp-news/1839-5g_cc_automation, Mar. 14, 2017.
[5] TR 36.912, "Feasibility study for Further Advancements for E-UTRA (LTE-Advanced) (Release 9)"
[6] 3GPP Organisation, "SC-PTM, an agile broadcast/multicast mechanism", [Online], Available at: http://www.3gpp.org/more/1763-sc_ptm, Jan. 28, 2016.
[7] TS 36.300, "LTE; Evolved Universal Terrestrial Radio Access (E-UTRA) and Evolved Universal Terrestrial Radio Access Network (E-UTRAN); Overall description; Stage 2 (Release 13)".
[8] "Polar Coded HARQ Scheme with Chase Combining", Kai Chen, Kai Niu, Zhiqiang He and Jiaru Lin, Key Laboratory of Universal Wireless Communications, ministry of Education Beijing University of Posts and Telecommunications, Beijing, China 100876, accessed 21 Aug. 2018 from https://arxiv.org/pdf/1310.6650.pdf Annex 1

LTE Wireless Access Interface

Embodiments of the present technique are not limited to a particular wireless communications standard, but find general application with a mobile communications system in which a transmitter and a receiver are configured to communicate data in units, transport blocks or packets for which some indication of feedback is provided as part of an ARQ type protocol. However, the following example embodiments will be explained with reference to a 3GPP defined LTE architecture. Those acquainted with LTE will appreciate that a wireless access interface configured in accordance with an LTE standard uses an orthogonal frequency division modulation (OFDM) based wireless access interface for the radio downlink (so-called OFDMA) and a single carrier frequency division multiple access scheme (SC-FDMA) on the radio uplink. The down-link and the up-link of a wireless access interface according to an LTE standard is presented in FIGS. 14 and 15.

FIG. 14 provides a simplified schematic diagram of the structure of a downlink of a wireless access interface that may be provided by or in association with the eNB of FIG. 1 when the communications system is operating in accordance with the LTE standard. In LTE systems the wireless access interface of the downlink from an eNB to a UE is based upon an orthogonal frequency division multiplexing (OFDM) access radio interface. In an OFDM interface the resources of the available bandwidth are divided in frequency into a plurality of orthogonal subcarriers and data is transmitted in parallel on a plurality of orthogonal subcarriers, where bandwidths between 1.4 MHZ and 20 MHz bandwidth may be divided into orthogonal subcarriers. Not all of these subcarriers are used to transmit data (some are used to carry reference information used for channel estimation at the receiver for example) whilst some at the edge of the band are not used at all. For LTE, the number of subcarriers varies between 72 subcarriers (1.4 MHz) and 1200 subcarriers (20 MHz), but it will be appreciated that for other wireless access interfaces, such as NR or 5G, the number of sub-carriers and the bandwidth may be different. In some examples the subcarriers are grouped on a basis of $2^n$, for example 128 to 2048, so that both a transmitter and a receiver can use an inverse and a forward Fast Fourier Transform to convert the sub-carriers from the frequency domain to the time domain and from the time domain to the frequency domain respectively. Each subcarrier bandwidth may take any value but in LTE it is fixed at 15 kHz.

As shown in FIG. 14, the resources of the wireless access interface are also temporally divided into frames where a frame 200 lasts 10 ms and is subdivided into 10 sub-frames 1201 each with a duration of 1 ms. Each sub-frame 201 is formed from 14 OFDM symbols and is divided into two slots 1220, 1222 each of which comprise six or seven OFDM symbols depending on whether a normal or extended cyclic prefix is being utilised within OFDM symbols for the reduction of inter symbol interference. The resources within a slot may be divided into resources blocks 1203 each comprising 12 subcarriers for the duration of one slot and the resource blocks are further divided into resource elements 1204 which span one subcarrier for one OFDM symbol, where each rectangle 1204 represents a resource element. The resource elements distributed in time within a sub-frame and frequency across the host system bandwidth represent the communications resources of the host system.

The simplified structure of the downlink of an LTE wireless access interface presented in FIG. 14, also includes an illustration of each sub-frame 1201, which comprises a control region 1205 for the transmission of control data, a data region 1206 for the transmission of user data and reference signals 207 which are interspersed in the control and data regions in accordance with a predetermined pattern. The control region 1205 may contain a number of physical channels for the transmission of control data, such as a physical downlink control channel (PDCCH), a physical control format indicator channel (PCFICH) and a physical HARQ indicator channel (PHICH). The data region may contain a number of physical channels for the transmission of data or control, such as a physical downlink shared channel (PDSCH), enhanced physical downlink control channel (ePDCCH) and a physical broadcast channel (PBCH). Although these physical channels provide a wide range of functionality to LTE systems, in terms of resource allocation and the present disclosure, PDCCH and PDSCH are most relevant. Further information on the structure and functioning of the physical channels of LTE systems can be found in [1].

Resources within the PDSCH may be allocated by an eNodeB to UEs being served by the eNodeB. For example, a number of resource blocks of the PDSCH may be allocated to a UE in order that it may receive data that it had previously requested or data which is being pushed to it by the eNodeB, such as radio resource control (RRC) signalling. In FIG. 14, UE1 has been allocated resources 1208 of the data region 1206, UE2 resources 1209 and UE3 resources 1210. UEs in an LTE system may be allocated a fraction of the available resources for the PDSCH and therefore UEs are required to be informed of the location of their allocated resources within the PDCSH so that only relevant data within the PDSCH is detected and estimated. In order to inform the UEs of the location of their allocated communications resource elements, resource control information specifying downlink resource allocations is conveyed across the PDCCH in a form termed downlink control information (DCI), where resource allocations for a PDSCH are communicated in a preceding PDCCH instance in the same sub-frame.

FIG. 15 provides a simplified schematic diagram of the structure of an uplink of an LTE wireless access interface that may be provided by or in association with the eNodeB of FIG. 1. In LTE networks the uplink wireless access interface is based upon a single carrier frequency division multiplexing FDM (SC-FDM) interface and downlink and uplink wireless access interfaces may be provided by frequency division duplexing (FDD) or time division duplexing (TDD), where in TDD implementations sub-frames switch between uplink and downlink sub-frames in accordance with predefined patterns. However, regardless of the form of duplexing used, a common uplink frame structure is utilised. A frame 1300 is divided into 10 sub-frames 1301 of 1 ms duration where each sub-frame 1301 comprises two slots 1302 of 0.5 ms duration. Each slot is then formed from seven OFDM symbols 1303 where a cyclic prefix 1304 is inserted between each symbol in a manner equivalent to that in downlink sub-frames.

As shown in FIG. 15, each LTE uplink sub-frame may include a plurality of different channels, for example a physical uplink communications channel (PUSCH) 1305, a physical uplink control channel (PUCCH) 1306, and a physical random access channel (PRACH). The physical Uplink Control Channel (PUCCH) may carry control information such as ACK/NACK to the eNodeB for downlink transmissions, scheduling request indicators (SRI) for UEs wishing to be scheduled uplink resources, and feedback of downlink channel state information (CSI) for example. The PUSCH may carry UE uplink data or some uplink control data. Resources of the PUSCH are granted via PDCCH, such a grant being typically triggered by communicating to the network the amount of data ready to be transmitted in a buffer at the UE. The PRACH may be scheduled in any of the resources of an uplink frame in accordance with a one of a plurality of PRACH patterns that may be signalled to UE in downlink signalling such as system information blocks. As well as physical uplink channels, uplink sub-frames may also include reference signals. For example, demodulation reference signals (DMRS) 1307 and sounding reference signals (SRS) 1308 may be present in an uplink sub-frame where the DMRS occupy the fourth symbol of a slot in which PUSCH is transmitted and are used for decoding of PUCCH and PUSCH data, and where SRS are used for uplink channel estimation at the eNodeB. The ePDCCH channel carries similar control information (DCI) as the PDCCH, but the physical aspects of PDCCH are different to those of ePDCCH, as discussed elsewhere herein. Further information on the structure and functioning of the physical channels of LTE systems can be found in [1].

In an analogous manner to the resources of the PDSCH, resources of the PUSCH are required to be scheduled or granted by the serving eNodeB and thus if data is to be transmitted by a UE, resources of the PUSCH are required to be granted to the UE by the eNodeB. At a UE, PUSCH resource allocation is achieved by the transmission of a scheduling request or a buffer status report to its serving eNodeB. The scheduling request may be made, when there is insufficient uplink resource for the UE to send a buffer status report, via the transmission of Uplink Control Information (UCI) on the PUCCH when there is no existing PUSCH allocation for the UE, or by transmission directly on the PUSCH when there is an existing PUSCH allocation for the UE. In response to a scheduling request, the eNodeB is configured to allocate a portion of the PUSCH resource to the requesting UE sufficient for transferring a buffer status report and then inform the UE of the buffer status report resource allocation via a DCI in the PDCCH. Once or if the UE has PUSCH resource adequate to send a buffer status report, the buffer status report is sent to the eNodeB and gives the eNodeB information regarding the amount of data in an uplink buffer or buffers at the UE. After receiving the buffer status report, the eNodeB can allocate a portion of the PUSCH resources to the sending UE in order to transmit some of its buffered uplink data and then inform the UE of the resource allocation via a DCI in the PDCCH. For example, presuming a UE has a connection with the eNodeB, the UE will first transmit a PUSCH resource request in the PUCCH in the form of a UCI. The UE will then monitor the PDCCH for an appropriate DCI, extract the details of the PUSCH resource allocation, and transmit uplink data, at first comprising a buffer status report, and/or later comprising a portion of the buffered data, in the allocated resources.

Although similar in structure to downlink sub-frames, uplink sub-frames have a different control structure to downlink sub-frames, in particular the upper 1309 and lower 1310 subcarriers/frequencies/resource blocks of an uplink sub-frame are reserved for control signaling rather than the initial symbols of a downlink sub-frame. Furthermore, although the resource allocation procedure for the downlink and uplink are relatively similar, the actual structure of the resources that may be allocated may vary due to the different characteristics of the OFDM and SC-FDM interfaces that are used in the downlink and uplink respectively. In OFDM each subcarrier is individually modulated and therefore it is not necessary that frequency/subcarrier allocation are contiguous however, in SC-FDM subcarriers are modulated in combination and therefore if efficient use of the available resources are to be made, contiguous frequency allocations for each UE may be preferable.

What is claimed is:

1. A method of operating a communications device to receive data from a wireless communications network, the method comprising:
    detecting, from a control channel of a wireless access interface, encoded data units of a plurality of encoded data units into which an error correction encoded control information has been divided in accordance with an incremental redundancy scheme, and
    decoding the error correction encoded control information by combining the detected encoded data units in accordance with an arrangement of encoded bits of the error correction encoded control information in each encoded data unit of the plurality of encoded data units, wherein
    each encoded data unit of the plurality of encoded data units comprises a different set of the encoded bits according to a different redundancy version number of the incremental redundancy scheme,
    the combining the detected encoded data units includes
        identifying each encoded data unit of the detected encoded data units from physical resources of the control channel on which the detected encoded data units are detected to determine the redundancy version of each encoded data unit,
        identifying the arrangement of encoded bits of the error correction encoded control information in each of the detected encoded data units based on the determined redundancy version, and
        combining the encoded bits from the detected encoded data units in accordance with the incremental redundancy scheme,
    the physical resources comprise a plurality of Orthogonal Frequency Division Multiplexing (OFDM) symbols, and
    the identifying each encoded data unit of the detected encoded data units comprises
        determining a number of the OFDM symbols on which each of the encoded data units were detected, each of the encoded data units having been transmitted on a resource including a corresponding one of the plurality of OFDM symbols of the control channel, and
        identifying the each encoded data unit from the number of the OFDM symbols of the control channel.

2. The method according to claim 1, wherein
    the physical resources are divided into a plurality of synchronous time divided units, and
    the identifying each encoded data unit of the detected encoded data units further comprises determining a number of the time units in which the encoded data units are detected, each of the encoded data units having been transmitted in a resource including a corresponding time unit number, and identifying the encoded data unit from the number of the time units on which the encoded data unit was detected.

3. The method according to claim 1, further comprising:
    receiving a control message indicating which of the plurality of OFDM symbols on the control channel a corresponding one of the encoded data units was transmitted.

4. The method according to claim 1, wherein
    the physical resources are divided into a plurality of synchronous time divided units, and
    the identifying each encoded data unit of the detected encoded data units from the physical resources further comprises determining a pattern of the physical resources from which the encoded data units are detected, each of the encoded data units having been transmitted in a resource including one of the time units using the physical resources of the control channel of the wireless access interface in accordance with one of a set of different patterns, and determining the encoded data unit by identifying the pattern of the physical resources of the control channel within a time unit of the wireless access interface.

5. The method according to claim 1, wherein
    the physical resources are divided into a plurality of synchronous time divided units, and
    the identifying encoded data unit each of the detected encoded data units from the physical resources further comprises determining control channel monitoring occasions from a pattern of the physical resources on which the encoded data units are detected, each of the encoded data units having been transmitted in a resource starting in a first time unit of the control channel monitoring occasion.

6. The method according to claim 4, wherein the physical resources of the control channel are divided into control channel elements with an index, the control channel elements forming part of a resource element group which have a resource element group index, and each of the patterns of the physical resources is dependent upon the control channel element index and the resource element group index.

7. The method according to claim 6, wherein the physical resources of the control channel are divided into control channel elements with an index, and the encoded data unit is determined based on the physical resources comprising at least a control channel index with a particular index.

8. The method according to claim 6, wherein
    the control channel elements and the resource element groups are formed from a control resource set of physical resources of the control channel for each of the time units, and
    the identifying each encoded data unit of the detected encoded data units includes determining the control resource set from which the encoded data unit was detected.

9. The method according to claim 1, wherein the identifying each encoded data unit of the detected encoded data units from the physical resources further comprises searching for the encoded data units within a search space formed within the physical resources of the control channel and determining the encoded data unit from an order in which the encoded data units are detected.

10. The method according to claim 1, further comprising:
receiving an indication of a total number of the detected encoded data units which are used to transmit the control information.

11. The method according to claim 1, further comprising:
determining a total number of the detected encoded data units which are used to transmit the control information from a number of aggregation levels which are configured for receiving control information transmitted via the control channel.

12. The method according to claim 1, further comprising:
using the control information to receive data transmitted to the communications device on a shared channel of the wireless access interface, to signal that the communications device should transmit on a Physical Uplink Shared Channel (PUSCH) to request the communications device to perform a function or to send timing advance information.

13. A method of operating a communications device to receive data from a wireless communications network, the method comprising:
detecting, from a control channel of a wireless access interface, encoded data units of a plurality of encoded data units into which an error correction encoded control information has been divided; and
decoding the error correction encoded control information by combining the detected encoded data units in accordance with an arrangement of encoded bits of the error correction encoded control information in each encoded data unit of the plurality of encoded data units, wherein
the plurality of encoded data units into which an error correction encoded control information has been divided are transmitted in accordance with either
a repeated transmission of one or more sections into which the error correction encoded control information is divided, or
an incremental redundancy scheme in which each encoded data unit of the plurality of encoded data units includes a different set of encoded bits of the error correction encoded control information and a different redundancy version number according to the incremental redundancy scheme,
the combining the detected encoded data units includes
determining whether the error correction encoded control information has been transmitted in accordance with the repeated transmission or the incremental redundancy scheme,
in a case that the error correction encoded control information has been transmitted in accordance with the incremental redundancy scheme, combining the detected encoded data units in accordance with the incremental redundancy scheme,
in a case that the error correction encoded control information has been transmitted in accordance with the repeated transmission, combining the encoded data units of the repeated transmission of the one or more sections of the error correction encoded control information in accordance with a chase combining scheme,
the combining the detected encoded data units in accordance with the incremental redundancy scheme further comprises:
identifying each encoded data unit of the detected encoded data units from physical resources of the control channel on which the detected encoded data units are detected to determine the redundancy version number of each encoded data unit,
identifying the arrangement of encoded bits of the error correction encoded control information in each of the detected encoded data units based on the determined redundancy version number, and
combining the encoded bits from the detected encoded data units in accordance with the incremental redundancy scheme,
the physical resources comprise a plurality of Orthogonal Frequency Division Multiplexing (OFDM) symbols, and
the identifying each encoded data unit of the detected encoded data units comprises
determining a number of the OFDM symbols on which each of the encoded data units were detected, each of the encoded data units having been transmitted on a resource including a corresponding one of the plurality of OFDM symbols of the control channel, and
identifying the each encoded data unit from the number of the OFDM symbols of the control channel.

14. The method according to claim 13, wherein
the error correction encoded control information is transmitted using either the repeated transmission or the incremental redundancy scheme depending on a search space type, and
the determining whether the error correction encoded control information has been transmitted in accordance with the repeated transmission or the incremental redundancy scheme includes determining the search space type.

15. The method according to claim 14, wherein the search space type is one of a common search space or a search space specific to the communications device.

16. The method according to claim 13, wherein
the error correction encoded control information is transmitted using either the repeated transmission or the incremental redundancy scheme depending on a transmission of the data in the shared channel on a time unit into which the wireless access interface is divided or a sub-time unit into which the time unit is divided, and
the determining whether the error correction encoded control information has been transmitted in accordance with the repeated transmission or the incremental redundancy scheme includes determining whether the data is being transmitted in the shared channel on a time unit or a sub-time unit basis.

17. The method according to claim 16, wherein the time-unit is a slot of a sub-frame of the wireless access interface and sub-time unit is a mini-slot.

18. A communications device for receiving data from a wireless communications network, the communications device comprising:
receiver circuitry configured to receive radio signals transmitted via a wireless access interface provided by the wireless communications network; and
controller circuitry configured in combination with the receiver circuitry to
detect, from a control channel of a wireless access interface, encoded data units of a plurality of encoded data units into which an error correction encoded control information has been divided in accordance with an incremental redundancy scheme; and
decode the error correction encoded control information by combining the detected encoded data units in accordance with an arrangement of encoded bits of the error correction encoded control information in each encoded data unit of the plurality of encoded data units, wherein each encoded data unit of the plurality of encoded data units comprises a different set of the encoded bits according to a different redundancy version number of the incremental redundancy scheme, the combining the detected encoded data units includes
identifying each encoded data unit of the detected encoded data units from physical resources of the control channel on which the detected encoded data units are detected to determine the redundancy version of each encoded data unit, identifying the arrangement of encoded bits of the error correction encoded control information in each of the detected encoded data units based on the determined redundancy version, and combining the encoded bits from the detected encoded data units in accordance with the incremental redundancy scheme, the physical resources comprise a plurality of Orthogonal Frequency Division Multiplexing (OFDM) symbols, and the identifying each encoded data unit of the detected encoded data units comprises
determining a number of the OFDM symbols on which each of the encoded data units were detected, each of the encoded data units having been transmitted on a resource including a corresponding one of the plurality of OFDM symbols of the control channel, and
identifying the each encoded data unit from the number of the OFDM symbols of the control channel.

* * * * *